US010578696B2

(12) United States Patent
Gonen et al.

(10) Patent No.: US 10,578,696 B2
(45) Date of Patent: Mar. 3, 2020

(54) SYSTEM, METHOD AND COMPUTER-ACCESSIBLE MEDIUM FOR SPECTROSCOPIC LOCALIZATION USING SIMULTANEOUS ACQUISITION OF DOUBLE SPIN AND STIMULATED ECHOES

(71) Applicant: New York University, New York, NY (US)

(72) Inventors: Oded Gonen, Leonardo, NJ (US); Assaf Tal, New York, NY (US)

(73) Assignee: New York University, New York, NY (US)

(*) Notice: Subject to any disclaimer, the term of this patent is extended or adjusted under 35 U.S.C. 154(b) by 1149 days.

(21) Appl. No.: 14/677,274

(22) Filed: Apr. 2, 2015

(65) Prior Publication Data
US 2015/0285878 A1  Oct. 8, 2015

Related U.S. Application Data

(60) Provisional application No. 61/974,401, filed on Apr. 2, 2014.

(51) Int. Cl.
*G01R 33/46* (2006.01)
*G01R 33/465* (2006.01)
*G01R 33/561* (2006.01)
*G01R 33/56* (2006.01)
*G01R 33/485* (2006.01)

(52) U.S. Cl.
CPC .................. *G01R 33/485* (2013.01)

(58) Field of Classification Search
CPC ............. G01R 33/485; G01R 33/5615; G01R 33/5616; G01R 33/56554; G01R 33/465; G01R 33/4616; G01R 33/4625; G01R 33/5608; A61B 5/055
USPC .................................................. 324/300–322
See application file for complete search history.

(56) References Cited

U.S. PATENT DOCUMENTS

| 5,623,207 | A  | * | 4/1997 | Weissenberger | ... G01R 33/5615 324/300 |
|---|---|---|---|---|---|
| 2002/0153892 | A1 | * | 10/2002 | Roell | ................. G01R 33/5615 324/309 |
| 2013/0249548 | A1 | * | 9/2013 | Stemmer | ............ G01R 33/4835 324/309 |
| 2014/0210471 | A1 | * | 7/2014 | Stemmer | .......... G01R 33/56554 324/309 |

OTHER PUBLICATIONS

Boesch, Ch, R. Gruetter, and E. Martin. "Temporal and spatial analysis of fields generated by eddy currents in superconducting magnets: optimization of corrections and quantitative characterization of magnet/gradient systems." Magnetic resonance in medicine 20.2 (1991): 268-284.*

(Continued)

*Primary Examiner* — Rishi R Patel
(74) *Attorney, Agent, or Firm* — Hunton Andrews Kurth LLP

(57) ABSTRACT

Method, system and non-transitory computer-accessible medium can be provided for performing magnetic resonance spectroscopy for at least one structure. For example, with such method and/or computer-accessible medium, it is possible to receive information related to a substantially simultaneous acquisition of a stimulated echo pathway and a double spin echo associated with at least one portion of the at least one structure.

23 Claims, 9 Drawing Sheets

(56) References Cited

OTHER PUBLICATIONS

Shi, Xianfeng, Seong-Eun Kim, and Eun-Kee Jeong. "Single-shot T1 mapping using simultaneous acquisitions of spin- and stimulated-echo-planar imaging (2D ss-SESTEPI)." Magnetic resonance in medicine 64.3 (2010): 734-742.*

Nagy, Zoltán, David L. Thomas, and Nikolaus Weiskopf. "Orthogonalizing crusher and diffusion-encoding gradients to suppress undesired echo pathways in the twice-refocused spin echo diffusion sequence." Magnetic resonance in medicine 71.2 (Feb. 2013): 506-515.*

Zhu, Jian-Ming et al., "Stimulated Anti-Echo Selection in Spatially Localized NMR Spectroscopy," Journal Magn Reson, vol. 136, No. 1, pp. 1-5, 1999.

Yongbi, N.M. et al., "Quantification of Signal Selection Efficiency, Extra Volume Suppression and Contamination for ISIS, STEAM and PRESS Localized 1H NMR Spectroscopy using an EEC Localization Test Object," Phys Med Biol, vol. 40, No. 7, pp. 1293-1303, 1995.

Wokaun, A. et al. "Selective Detection of Multiple Quantum Transitions in Nmr by 2-Dimensional Spectroscopy," Chem Phys Lett, vol. 52, No. 3, pp. 407-412, 1977.

Wijmenga, Sybren S. et al., "Short Echo Time 1H MRSI of the Human Brain at 3T with Adiabatic Slice-Selective Refocusing Pulses; Reproducibility and Variance in a Dual Center Setting," Journal of Magnetic Resonance Imaging, vol. 31, No. 1, pp. 67-70, 2010.

Wijmenga, Sybren et al., "Doubly Sensitivity-Enhanced 3D TOCSY-HSQC," Journal Biomol NMR, vol. 8, No. 3, pp. 319-330, 1996.

Traber, Frank et al., "1H Metabolite Relaxation Times at 3.0 Tesla: Measurements of T1 and T2 Values in Normal Brain and Determination of Regional Differences in Transverse Relaxation," Journal of Magnetic Resonance Imaging, vol. 19, No. 5, pp. 537-545, 2004.

Torrey, H.C., "Bloch Equations with Diffusion Terms," Physical Review, vol. 104, No. 3, pp. 563-565, 1956.

Tal, Assaf et al., "Localization Errors in MR Spectroscopic Imaging Due to the Drift of the Main Magnetic Field and their Correction," Magn Reson Med, vol. 70, No. 4, pp. 895-904, Oct. 2012.

Song, Y.Q., "Categories of Coherence Pathways for the CPMG Sequence," Journal of Magnetic Resonance, vol. 157, No. 1, pp. 82-91, 2002.

Slotboom, J. et al., "A Single-Shot Localization Pulse Sequence Suited for Coils with Inhomogeneous RF Fields using Adiabatic Slice-Selective RF Pulses," Journal of Magnetic Resonance, vol. 95, pp. 396-404, 1991.

Shi, Xianfeng et al., "Single-Shot T1 Mapping using Simultaneous Acquisitions of Spin-and Stimulated-Echo-Planar Imaging (2D ss-SESTEPI),". Magn Reson Med, vol. 64, No. 3, pp. 734-742, 2010.

Schulte, Rolf F. et al., "Design of Phase-Modulated Broadband Refocusing Pulses," Journal of Magnetic Resonance, vol. 190, No. 2, pp. 271-279, 2008.

Scheenen, Tom W.J. et al., "Short Echo Time 1H-MRSI of the Human Brain at 3T With Minimal Chemical Shift Displacement Errors Using Adiabatic Refocusing Pulses," Magn Reson Med, vol. 59, pp. 1-6, 2008.

Palmer III, Arthur G. et al., "Sensitivity Improvements in Proton-Detected Two-Dimensional Heteronuclear Correlation NMR Spectroscopy," Journal of Magnetic Resonance, vol. 93, No. 1, pp. 151-170, 1991.

Ong, Henry et al., "A New Approach for Simultaneous Measurement of ADC and T2 from Echoes Generated via Multiple Coherence Transfer Pathways," Journal of Magnetic Resonance, vol. 173, No. 1, pp. 153-159, 2005.

Moonen, Chrit T.W. et al., "Proton Spectroscopic Imaging of Human Brain," Journal of Magnetic Resonance, vol. 98, pp. 556-575, 1992.

Moonen, Chrit T.W. et al., "Comparison of Single-Shot Localization Methods (STEAM and PRESS) for in Vivo Proton NMR Spectroscopy," NMR in Biomedicine, vol. 2, No. 5-6, pp. 201-208, 1989.

Meiboom, S. et al., "Method for Measuring Nuclear Relaxation Times," Reviews of Scientific Instruments, vol. 29, No. 8, pp. 688-691, 1958.

Maudsley, A.A. et al., "Spatially Resolved High Resolution Spectroscopy by "Four-Dimensional" NMR," Journal of Magnetic Resonance, vol. 51, No. 1, pp. 147-152, 1983.

Li, Belinda S.Y. et al., "Metabolite Ratios to Assumed Stable Creatine Level May Confound the Quantification of Proton Brain MR Spectroscopy," Magnetic Resonance Imaging, vol. 21, No. 8, pp. 923-928, 2003.

Kroenke, Christopher D. et al., "On the Nature of the NAA Diffusion Attenuated MR Signal in the Central Nervous System," Magn Reson Med, vol. 52, No. 5, pp. 1052-1059, 2004.

Kirov, Ivan I. et al., "Age Dependence of Regional Proton Metabolites T2 Relaxation Times in the Human Brain at 3T," Magn Reson Med, vol. 60, No. 4, pp. 790-795, 2008.

Keevil, Stephen F. "Spatial Localization in Nuclear Magnetic Resonance Spectroscopy," Phys Med Biol, vol. 51, No. 16, pp. R579-636, 2006.

Janich, Martin A. et al., "Robust Slice-Selective Broadband Refocusing Pulses," Journal of Magnetic Resonance, vol. 213, No. 1, pp. 126-135, 2011.

Janich, Martin A. et al., "Slice-Selective Broadband Refocusing Pulses for the Robust Generation of Crushed Spin-Echoes," Journal of Magnetic Resonance, vol. 223, pp. 129-137, 2012.

Hu, J. et al., "A Fast, Reliable, Automatic Shimming Procedure using 1H Chemical-Shift-Imaging Spectroscopy," Journal of Magnetic Resonance, Series B, vol. 108, pp. 213-219, 1995.

Hennig, J. et al., "The Application of Phase Rotation for Localized in Vivo Proton Spectroscopy with Short Echo Times," Journal of Magnetic Resonance, vol. 96, pp. 40-49, 1992.

Gyngell, Michael L. et al., "The Application of Steady-State Free Precession in Rapid 2DFT NMR Imaging: FAST and CE-FAST sequences," Magnetic Resonance Imaging, vol. 6, No. 4, pp. 415-419, 1988.

Goelman, Gadi et al., "Optimizing the Efficiency of High-Field Multivoxel Epectroscopic Imaging by Multiplexing in Space and Time," Magn Reson Med, vol. 56, No. 1, pp. 34-40, 2006.

Goelman, Gadi et al., "Chemical-Shift Artifact Reduction in Hadamard-Encoded MR Spectroscopic Imaging at High (3T and 7T) Magnetic Fields," Magn Reson Med, vol. 58, No. 1, pp. 167-173, 2007.

Gan, Zhehong et al., "Enhancing MQMAS Sensitivity using Signals from Multiple Coherence Transfer Pathways," Journal of Magnetic Resonance, vol. 168, No. 2, pp. 346-351, 2004.

Frahm, Jens et al., "Localized Proton Spectroscopy using Stimulated Echoes," Journal of Magnetic Resonance, vol. 72, pp. 502-508, 1987.

Carr, H.Y. et al., "Effects of Diffusion on Free Precession in Nuclear Magnetic Resonance Experiments," Physical Review, vol. 94, No. 3, pp. 630-638, 1954.

Burstein, Deborah., "Stimulated Echoes: Description, Applications, Practical Hints," Concepts in Magnetic Resonance, vol. 8, No. 4, pp. 269-278, 1996.

Broen, T.R. et al., "NMR Chemical Shift Imaging in Three Dimensions," Proceedings of the National Academy of Sciences, vol. 79, No. 11, pp. 3523-3526, 1982.

Bottomley, Paul A., "Spatial Localization in NMR Spectroscopy in Vivo," Ann N Y Acad Sci, vol. 508, pp. 333-348, 1987.

Boesch, C. et al., "Temporal and Spatial Analysis of Fields Generated by Eddy Currents in Superconducting Magnets: Optimization of Corrections and Quantitative Characterization of Magnet/Gradient Systems," Magn Reson Med, vol. 20, No. 2, pp. 268-284, 1991.

Barmet, Christoph et al., "Spatiotemporal Magnetic Field Monitoring for MR," Magn Reson Med, vol. 60, pp. 187-197, 2008.

Wijnen, J.P. et al., "Quantitative Short Echo Time 1H MRSI of the Peripheral Edematous Region of Human Brain Tumors in the Differentiation Between Glioblastoma, Metastasis, and Meningioma," Journal of Magnetic Resonance Imaging, vol. 36, pp. 1072-1082, 2012.

* cited by examiner

Figure 5A
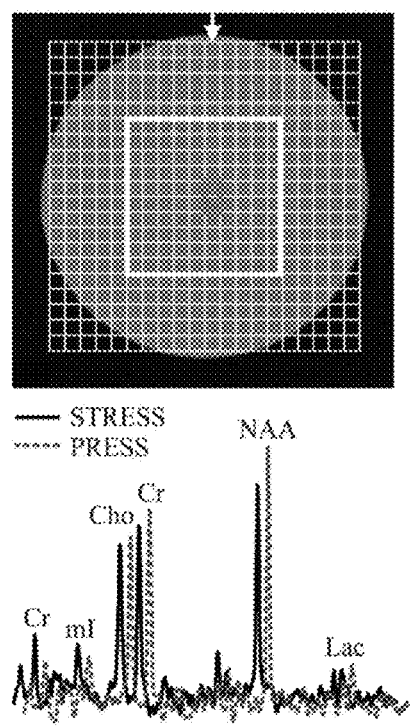
Figure 5B
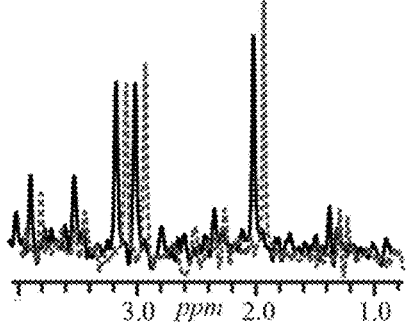
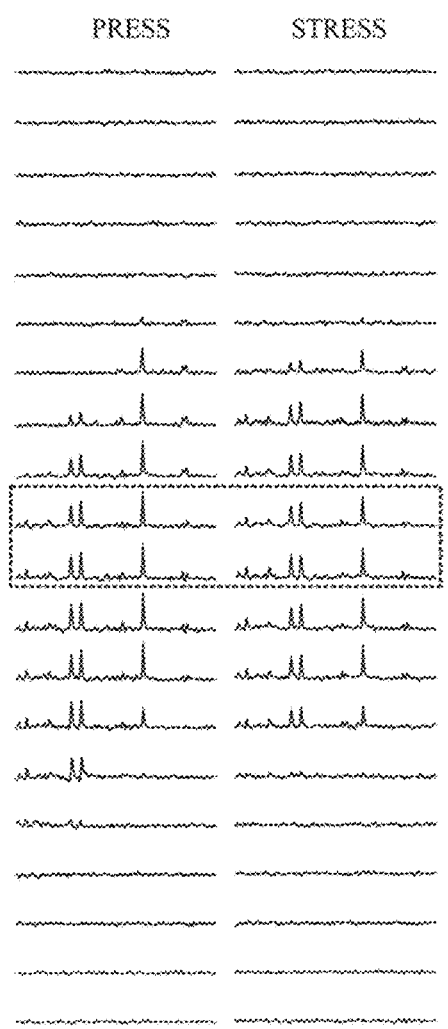
Figure 5C

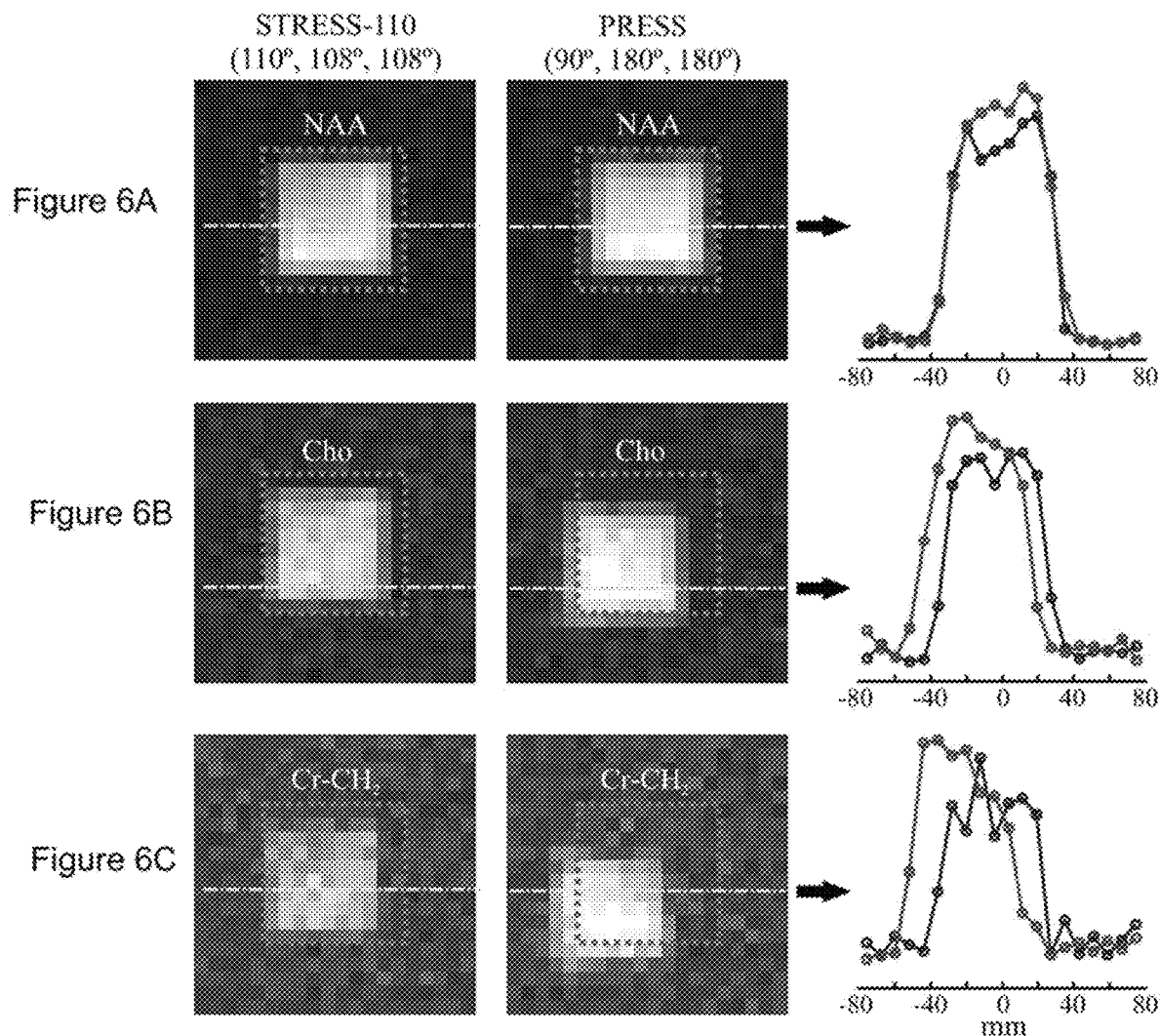

SYSTEM, METHOD AND COMPUTER-ACCESSIBLE MEDIUM FOR SPECTROSCOPIC LOCALIZATION USING SIMULTANEOUS ACQUISITION OF DOUBLE SPIN AND STIMULATED ECHOES

CROSS-REFERENCE TO RELATED APPLICATION(S)

This application relates to and claims priority from U.S. Patent Application No. 61/974,401, filed on Apr. 2, 2014, the entire disclosure of which is incorporated herein by reference.

STATEMENT REGARDING FEDERALLY SPONSORED RESEARCH

This invention was made with Government support under grant from National Institute of Health under Grant numbers NS050520 and EB01015. The Government has certain rights therein.

FIELD OF THE DISCLOSURE

The present disclosure relates generally to stimulated echo acquisition mode spectroscopy, and more specifically, to exemplary embodiments of systems, methods and computer-accessible mediums for providing a simultaneous acquisition of double-spin and stimulated echoes

BACKGROUND INFORMATION

Proton magnetic resonance ("MR") spectroscopy ("$^1$H-MRS") uses selective excitation of a volume of interest ("VOI") for localization, and to prevent aliasing in spectroscopic imaging ("$^1$H-MRSI"). (See, e.g., References 1-5). Two known and commonly used VOI excitation modules use three orthogonal spatially-selective pulses: 90°-180°-180° Point Resolved Spectroscopy ("PRESS") (see, e.g., Reference 1), or 90°-90°-90° Stimulated Echo Acquisition Mode ("STEAM"). (See, e.g., Reference 2). The three pulses generate nine transverse coherence pathways: three free induction decays ("FID"), four spin echoes ("SE") and two stimulated echoes ("STE"). (See, e.g., References 6 and 7). Judicious use of gradient spoiling can dephase all the pathways that originate from spins outside the VOI, which can result in an excellent rejection of outer volume contamination. (See, e.g., References 8, 9). PRESS and STEAM each refocus a single coherence pathway: the double spin echo (e.g., in PRESS) or one of the stimulated echoes (e.g., in STEAM), both of which originate from spins within the VOI.

For a given peak radio-frequency ("RF") power and specific absorption rate ("SAR"), STEAM's 90° pulses can offer several advantages over PRESS's 180° pulses: (i) SAR that can facilitate the reduction of the recycle time ("TR") to improve the signal-to-noise-ratio ("SNR")/unit-time (see, e.g., Reference 10); (ii) higher pulse bandwidths, which can lead to smaller chemical shift displacement ("CSD") (see, e.g., Reference 11); (iii) shorter echo times ("TE"), suffering less $T_2$ and J-coupling losses; and (iv) improved immunity to $B_{1+}$ variations. These, however, can come at a cost of about half the SNR per scan. (See, e.g., Reference 9). Since the metabolites' signals can be 4-5 orders of magnitude weaker than the water used in magnetic resonance imaging ("MRI"), the SNR advantage of PRESS can trump STEAM's advantages, and can be the method of choice for $^1$H-MRS experiments. PRESS's higher CSD in the two 180° pulse directions can be mitigated with high bandwidth refocusing pulses designed using, for example, optimal control theory (see, e.g., References 12 and 13), or the Shinnar-Le Roux procedure (see, e.g., Reference 14), but at a cost of increased SAR, which can become prohibitive when attempting to keep the same CSD. The spatial $B_{1+}$ variability can be addressed with adiabatic pulses, for example, SADLOVE (see, e.g., Reference 15) or LASER (see, e.g., References 16, 17 and 18), but their double-refocusing can prolong the minimum TE, and can increase SAR. The longer TE can attenuate signals of J-coupled metabolites that can often have short $T_2$s, while their higher SAR can prolong the repetition time, thereby reducing the SNR/unit-time.

While both PRESS and STEAM can select a single, particular coherence, pathway, there can be compelling advantages to combining multiple pathways. For example, solid and liquid state nuclear magnetic resonance ("NMR"), pulse sequences such as HNCA, TOCSY-HSQC and MQMAS, can combine different pathways for increased sensitivity (see, e.g., References 19-21), whereas multi-pulse MR imaging sequences can refocus multiple coherence pathways to generate contrast and boost sensitivity (see, e.g., Reference 22), or to simultaneously obtain maps of several parameters. (See, e.g., Reference 23). Similarly, refocusing the spin and stimulated echo pathways for efficient $T_1$ mapping has been suggested recently for echo planar $^1$H-MRSI. (See, e.g., Reference 24).

An exemplary three-pulse $^1$H-MRS localization paradigm can be modified by adjusting the three RF pulses' phases, flip angles, timings, and coherence selection gradients, in order to acquire both the double-spin and one of the stimulated echo pathways, this exemplary procedure can be denoted as STRESS (e.g., STEAM+PRESS). Utilizing the maximal $B_{1+}$ immunity can yield a family of STRESS sequences, parameterized by a (e.g., the flip angle of the first RF pulse). The $B_{1+}$ immunity can be shown to be superior to that of both PRESS and STEAM for most values of α. Results can be shown in a phantom and a healthy volunteer at 3 T for the 110°-108°-108° member of the STRESS family, which retains 83%-100% of the PRESS SNR (e.g., metabolite dependent) at only 75% of its SAR, and about 33% of its in-plane CSD for equal TE and TR, while also offering a shorter minimum echo time of, for example, TE=26.6 ms compared to PRESS's TE=40 ms.

Thus, it may be beneficial to provide an exemplary system, method and computer-accessible medium that can be used to, for example, simultaneously acquire a stimulated echo and a double spin echo, and which can overcome at least some of the deficiencies described herein above.

SUMMARY OF EXEMPLARY EMBODIMENTS

To that end, an exemplary method, system and non-transitory computer-accessible medium according to exemplary embodiments of the present disclosure can be provided for performing magnetic resonance spectroscopy for at least one structure. For example, with such system, method and/or computer-accessible medium, it can be possible to receive information related to a substantially simultaneous acquisition of a stimulated echo pathway and a double spin echo associated with at least one portion of the at least one structure.

For example, the information can include a constructive interference of the stimulated echo pathway and the double spin echo. The simulated echo pathway can have a first weight and the double spin echo can have a second weight which can be substantially the same as the first weight. In addition and/or alternatively, the simulated echo pathway can have a first phase, and the double spin echo can have a second phase which can be substantially the same as the first phase.

Further and/or alternatively, the simulated echo pathway and the double spin echo can have a first angle, a second angle and a third angle therebetween, according to an exemplary embodiment of the present disclosure. The first angle can be between about 90 degrees to about 140 degrees, and/or the second angle and the third angle can be substantially the same. The second angle and the third angle can depend on the first angle. In another exemplary embodiment of the present disclosure, the simulated echo pathway and the double spin echo can be substantially insensitive to inhomogeneities.

According to still another exemplary embodiment of the present disclosure, it can be possible to adjust the timing between respective pulses of the simulated echo pathway and the double spin echo, for example, such that the respective stimulated echo pathway pulse and the respective double spin echo pulse refocus at substantially the same time. In yet another exemplary embodiment of the present disclosure, it can be possible to adjust a gradient amplitude between respective pulses of the simulated echo pathway and the double spin. According to a further exemplary embodiment of the present disclosure, it can be possible to adjust a flip angle of respective pulses of the simulated echo pathway and the double spin. Further, it can be possible to generate at least one image of the portion(s) based on the information.

In some exemplary embodiments of the present disclosure, the stimulated echo pathway and the double spin echo can have different relaxation times. The information can further include an application of a pre-emphasis gradient pulse or a field mapping applied to the double spin echo to prevent a resonant frequency drift of the double spin echo. The stimulated echo pathway can include two stimulated echoes pulses, and the double spin echo can include four spin echo pulses.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 5A is a diagram of an exemplary placement of a phase-encoded matrix according to an exemplary embodiment of the present disclosure;

FIGS. 5B and 5C are signal diagrams of exemplary phantom results according to an exemplary embodiment of the present disclosure;

FIGS. 6A-6C are further illustrations of exemplary phantom results according to an exemplary embodiment of the present disclosure;

Figure 1:
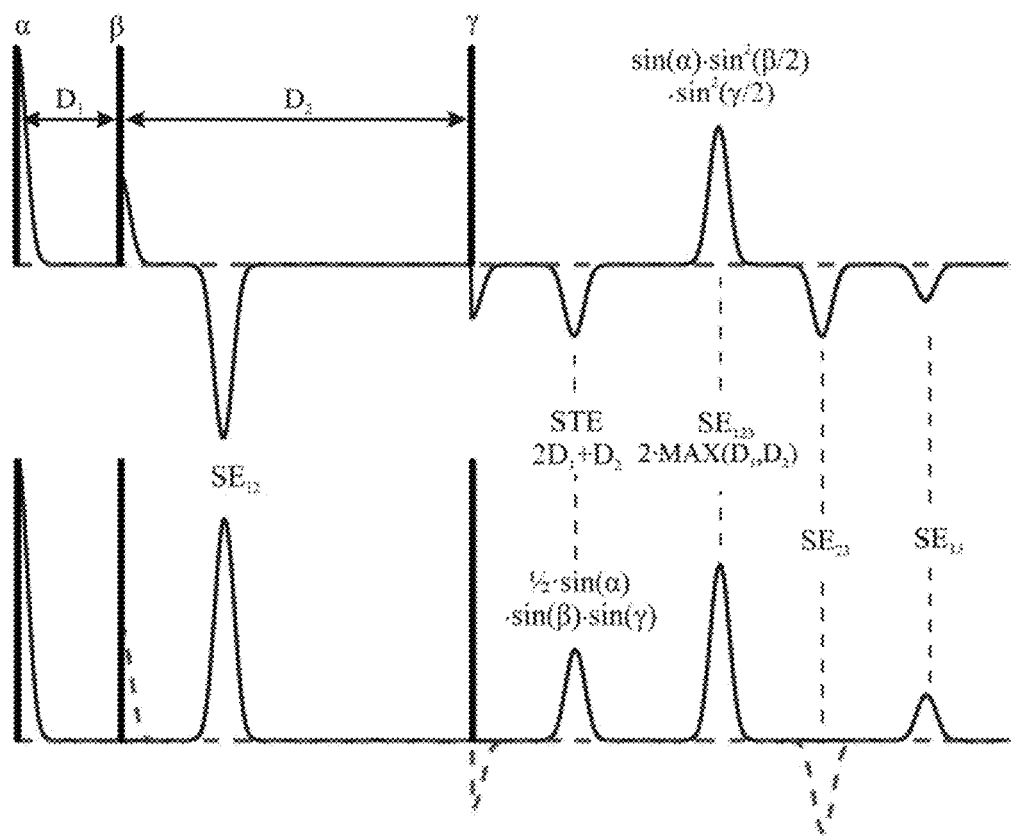
FIGS. 1A and 1B are graphs of exemplary echo formations according to an exemplary embodiment of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures or in the appended claims.

DETAILED DESCRIPTION OF EXEMPLARY EMBODIMENTS

Three pulses having flip angles $\alpha$, $\beta$, $\gamma$, can give rise to a total of nine transverse coherence pathways: (i) three free induction decays (e.g., FID1, FID2, FID3), (ii) four spin echoes (e.g., $SE_{12}$, $SE_{13}$, $SE_{23}$, $SE_{123}$) and (iii) two stimulated echoes (e.g., STE+, STE−), as illustrated in FIGS. 1A and 1B, where $\alpha=63°$ and $\beta=\gamma=126°$. (See, e.g., Reference 7). $SE_{ij}$ can denote the coherence excited by the $i^{th}$ pulse, and can be refocused by the $j^{th}$, and SE123 can refer to the doubly-refocused spin echo (e.g., PRESS) pathway. For example, two distinct STE+ and STE− coherence pathways, which can also be referred to as a stimulated echo and an anti-echo, cannot be refocused simultaneously, and only STE− can be observed in FIGS. 1A and 1B. (See, e.g., Reference 25). $SE_{123}$ and STE± can originate solely from within the VOI. All other pathways can be spoiled to achieve localization, by adjusting the inter-pulse spoiler gradients. (See, e.g., Reference 6). Within the VOI, each pathway's amplitude can be dependent on $\alpha$, $\beta$, $\gamma$, as summarized below in Table 1: $SE_{123}$'s amplitude can be proportional to $$\sin(\alpha)\sin^2\left(\frac{\beta}{2}\right)\sin^2\left(\frac{\gamma}{2}\right),$$

while STE−'s can be proportional to $\frac{1}{2}\sin(\alpha)\sin(\beta)\sin(\gamma)$.

TABLE 1

| Pathway's Name | Signal weighting in VOI | Total Gradient Moment Experienced | PRESS $k_1 = (1, 1, 1)$ $k_2 = (2, 2, 0)$ $k_3 = (1, 1, -1)$ | STRESS $k_1 = (1, 1, 1)$ $k_2 = (2, 2, 2)$ $k_3 = (1, 1, 1)$ |
|---|---|---|---|---|
| $FID_1$ | $\sin(\alpha)\cos^2\left(\frac{\beta}{2}\right)\cos^2\left(\frac{\gamma}{2}\right)$ | $k_1 + k_2 + k_3$ | (4, 4, 0) | (4, 4, 4) |
| $FID_2$ | $\cos(\alpha)\sin(\beta)\cos^2\left(\frac{\gamma}{2}\right)$ | $k_2 + k_3$ | (3, 3, -1) | (3, 3, 3) |
| $FID_3$ | $\cos(\alpha)\cos(\beta)\sin(\gamma)$ | $k_3$ | (1, 1, -1) | (1, 1, 1) |
| $SE_{12}$ | $\sin(\alpha)\sin^2\left(\frac{\beta}{2}\right)\cos^2\left(\frac{\gamma}{2}\right)$ | $-k_1 + k_2 + k_3$ | (2, 2, -2) | (2, 2, 2) |
| $SE_{13}$ | $\sin(\alpha)\cos^2\left(\frac{\beta}{2}\right)\sin^2\left(\frac{\gamma}{2}\right)$ | $-k_1 - k_2 + k_3$ | (-2, -2, -2) | -(2, 2, 2) |
| $SE_{23}$ | $\cos(\alpha)\sin(\beta)\sin^2\left(\frac{\gamma}{2}\right)$ | $-k_2 + k_3$ | (-1, -1, -1) | -(1, 1, 1) |
| $SE_{123}$ | $\sin(\alpha)\sin^2\left(\frac{\beta}{2}\right)\sin^2\left(\frac{\gamma}{2}\right)$ | $k_1 - k_2 + k_3$ | 0 | 0 |
| $STE_+$ | $\frac{1}{2}\sin(\alpha)\sin(\beta)\sin(\gamma)$ | $k_1 + k_3$ | (2, 2, 0) | (2, 2, 2) |
| $STE_-$ | $\frac{1}{2}\sin(\alpha)\sin(\beta)\sin(\gamma)$ | $-k_1 + k_3$ | (0, 0, -2) | 0 |

Figure 4A:
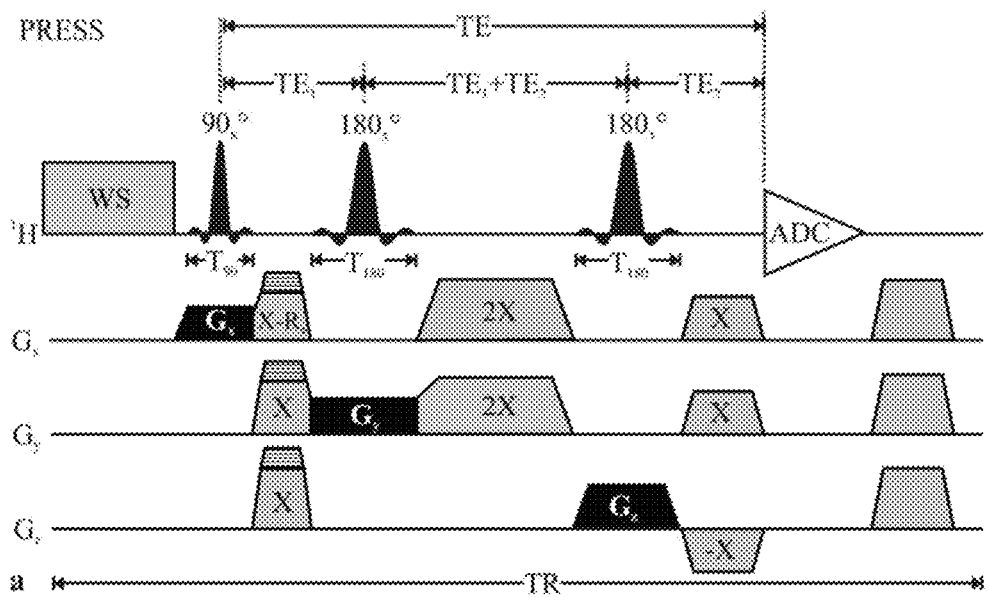
FIGS. 4A and 4B are diagrams of exemplary sequences for PRESS and CPMG-PRESS according to an exemplary embodiment of the present disclosure.

For example, any three pulses of α, β, γ nutation can generate nine transverse coherence pathways: (i) three FIDs following each pulse, (ii) four spin echoes ($SE_{12}$, $SE_{13}$, $SE_{23}$, $SE_{123}$) and (iii) two stimulated echoes ($STE_+$, $STE_-$). $FID_i$ can stand for the FID created by the $i^{th}$ pulse; $SE_{ij}$ can stand for the spin echo excited by the $i^{th}$ pulse and can be refocused by the $j^{th}$ pulse; and $SE_{123}$ can be the doubly refocused spin echo observed in the "standard" PRESS sequence. If a gradient having moment $k_j$ can be played after the $j^{th}$ pulse, each pathway can experience a total gradient moment shown in the third column. Also shown are two spoiling schemes, for example: (i) a "standard" PRESS procedure (see, e.g., Reference 6), designed to spoil all coherence pathways but $SE_{123}$, and a (ii) "modified" CPMG-like procedure, which can refocus both $SE_{123}$ and one of the stimulated echoes (STE). Refocused pathways are shaded. These two exemplary procedure can be used in the STRESS and PRESS sequences shown in FIGS. 4A and 4B, respectively.

To simultaneously refocus both $SE_{123}$ and STE-, while dephasing all other pathways, for example, four changes can be proposed to the basic three-pulse localization procedure: (i) Set the inter-pulse gradient spoiler moments to a 1:2:1 ratio (see e.g., Table 1 herein), (ii) Set the inter-pulse delays (e.g., center-to-center) to the same 1:2:1 ratio: $\tau$=TE/4 between the excitation and first second pulse, $2\tau$=TE/2 between the second and third pulses and $\tau$=TE/4 between the last pulse and acquisition, (iii) implement a "Carr-Purcell-Meiboom-Gill ("CPMG") condition", where the second and third pulses' phases' can be incremented by 90° relative to the first and (iv) modify the flip angles of the three pulses as detailed below, and indicated in FIG. 2 and Table 2 below.

TABLE 2

| α (deg.) | β = γ (deg.) | Signal (η = 1, $T_2$ = ∞, $T_1$ = ∞) | Signal (η = 0.75, $T_2$ = ∞, $T_1$ = ∞) | Signal (η = 1, $T_2$ = 150 ms, $T_1$ = 1200 ms, TE = 40 ms) | Signal (η = 0.75, $T_2$ = 150 ms, $T_1$ = 1200 ms, TE = 40 ms) |
|---|---|---|---|---|---|
| 90 | 180 | 1.0 | 0.9 | 0.77 | 0.71 |
| 95 | 144 | 0.99 | 0.83 | 0.77 | 0.68 |
| 100 | 131 | 0.95 | 0.79 | 0.76 | 0.65 |
| 105 | 119 | 0.90 | 0.73 | 0.73 | 0.61 |
| 110 | 108 | 0.83 | 0.66 | 0.67 | 0.55 |
| 115 | 96 | 0.72 | 0.55 | 0.59 | 0.48 |
| 120 | 80 | 0.57 | 0.41 | 0.48 | 0.37 |
| 125 | 62 | 0.37 | 0.25 | 0.32 | 0.24 |
| PRESS: | | | | | |
| 90 | 180 | 1.0 | 0.67 | 0.77 | 0.52 |
| STEAM: | | | | | |
| 90 | 90 | 0.5 | 0.39 | 0.43 | 0.34 |

Table 2 indicates relative signal amplitudes in homogeneous (η=1.0) and inhomogeneous (η=0.75) $B_{1+}$ field, for different STRESS family members (Eq. (3) with $S_0$=1 and TR=∞), with PRESS and STEAM for comparison. Relaxation can be neglected in the third and fourth columns, and can be included in the fifth and sixth columns. Further shown in the fourth and sixth columns, in parenthesis, is the percent decline in the signal relative to the case with no $B_{1+}$ inhomogeneity. For example, α, β and γ can be the flip angles of the first, second and third VOI localization pulses. As α can increase, the signal amplitude and the immunity to $B_{1+}$ can decrease. Additionally, β and γ also can decrease, which can reduce the relative SAR, and increase the pulses' bandwidths (reducing in-plane CSD). Thus, there can be a trade-off of SAR and CSD and SNR and $B_{1+}$-immunity. The α>115° cases begin performing unfavorably and should generally be avoided. When α=90°, the STRESS sequence coincides with PRESS, but has the additional $B_{1+}$ immunity of the CPMG condition, making it considerably more robust to $B_{1+}$ inhomogeneities than a standard PRESS. (See e.g., FIG. 3A). Further, when relaxation can be taken into effect, STRESS can suffer an even smaller penalty to SNR compared to PRESS, and can sometimes even surpass it, as illustrated in the fifth column. This can be a result of the shorter effective echo time of the stimulated echo pathway.

Exemplary procedures can be understood by examining the standard CPMG sequence used for T2 relaxometry (see, e.g., Reference 26), where, for example:

$$90°_{0°}\text{-}\tau\text{-}180°_{90°}\text{-}\tau\text{-}[echo]\text{-}\tau\text{-}180°_{90°}\text{-}\tau\text{-}[echo]\text{-}\ldots$$

where only T2* decay can be accumulated between the pulses. It can be assumed that T2* can be caused by a spatially linear B0-field inhomogeneity; the effect can be analogous to the 1:2:1 gradient-moment ratio suggested above. For example, the inter-pulse timing modification can assure $SE_{123}$ and STE- can refocus at the same time, as can also be seen from FIGS. 1A and 1B. The CPMG condition can ensure $SE_{123}$ and STE- can both be in-phase to add constructively (e.g., the comparison of the graphs shown in FIGS. 1A with 1B).

Exemplary Flip Angle Calibration

If the relaxation is not considered, the combined amplitude of $SE_{123}$+STE- can be $$\sin(\alpha)\sin^2\left(\frac{\beta}{2}\right)\sin^2\left(\frac{\gamma}{2}\right) + \frac{1}{2}\sin(\alpha)\sin(\beta)\sin(\gamma).$$

In one exemplary case, the VOI can often be square in-plane, and the β=γ case can be examined, although the results derived below can be valid regardless of the VOI's dimensions. In an exemplary general case, according to another exemplary embodiment of the present disclosure, it may not be necessary for β and γ to be equal. In the event of B1+ inhomogeneity, the signal's dependence on η can be determined, and the scaling of the B1 field can be, for example:

$$S(\eta) = \sin(\eta\alpha)\left[\sin^2\left(\frac{\eta\beta}{2}\right)\sin^2\left(\frac{\eta\gamma}{2}\right) + \frac{1}{2}\sin(\eta\beta)\sin(\eta\gamma)\right] \quad (1)$$

Figure 2:
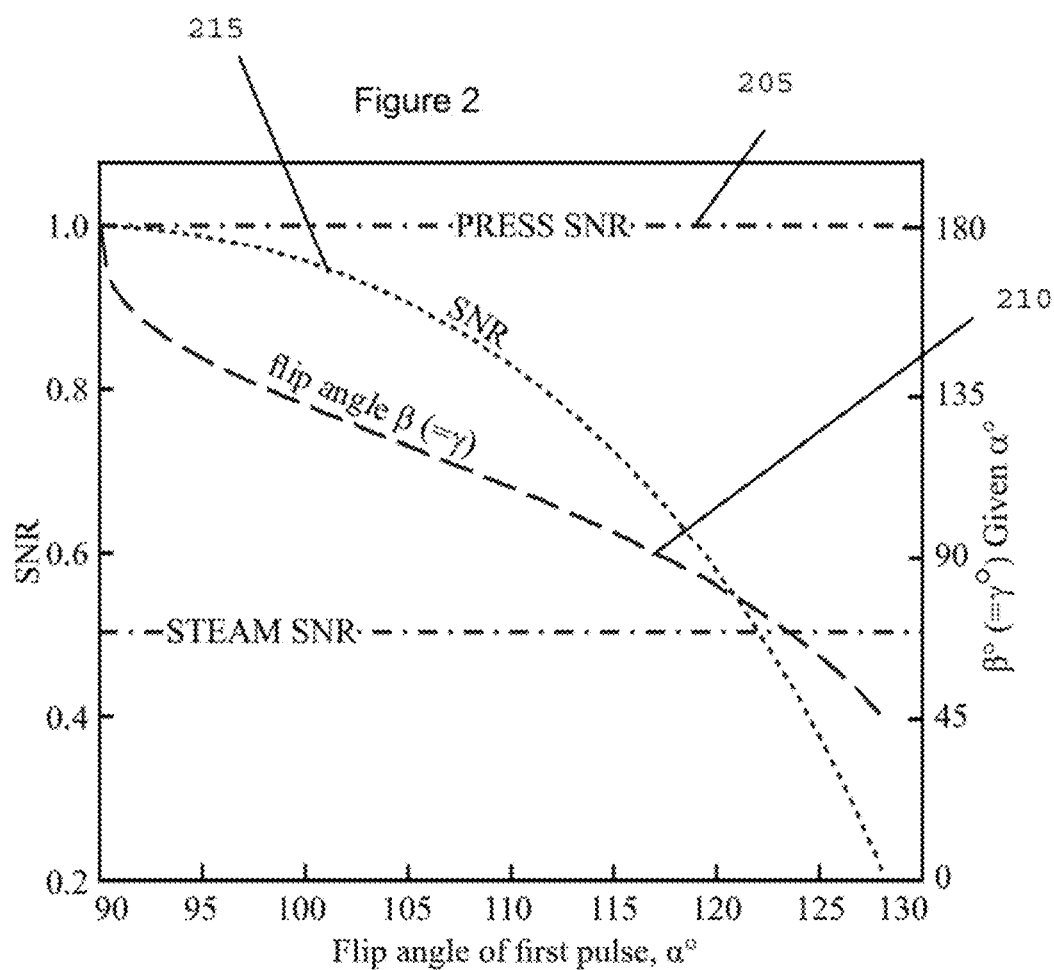
FIG. 2 is a graph illustrating exemplary flip angles and signal amplitudes for a STRESS family of sequences according to an exemplary embodiment of the present disclosure.

Fixing α, and demanding both maximal immunity to B1+ variations at nominal B1+ (η=1) and maximal signal intensity can produce, for example:

$$\left(\frac{\partial S}{\partial \eta}\right)_{\eta=1} = 0, \quad (2a)$$

$$\max_{\beta,\gamma} S(\alpha, \beta, \gamma)\Big|_{\eta=1} \quad (2b)$$

Where an implicit relation between the flip angles α, β, γ can be obtained. Numerically solving for γ as a function of α and β can yield a family of exemplary STRESS pulse sequences. This is shown in FIG. 2, which depicts γ and the signal S(α, β, γ)/(relative to PRESS) (e.g., line 205) as a function of α and β. Thus, each point in the (α, β) plane can represent a possible member of the STRESS family, which can be marked as STRESS-(α, β). In particular, if β=γ, (e.g., line 210) a particularly simple subset of STRESS sequences, STRESS-(α, α), appear to portray high SNR (e.g., line 215).

It can be possible to refer to these exemplary sequences as STRESS-α. For those members (β=γ), the flip angle β, as well as the SNR 215 relative to PRESS 205, are shown as a function of α in FIG. 2 for a homogeneous B1+ field (η=1). Various specific flip angle values are summarized in Table 2 below. For α=90° or β=γ=180°, the flip angles of exemplary STRESS-90 can coincide with PRESS. As α can increase from 90°, β can decrease sharply from 180°. According to one exemplary embodiment of the present disclosure, it can be possible to confine many or all of the examples to the β=γ case for simplicity (e.g., the subset of sequences marked by STRESS-α). However, according to another exemplary embodiment of the present disclosure, it should be understood that the exemplary systems, method and computer accessible medium can be used for and a general case as indicated herein above for Eqs. (2a) and (2b).

Figure 3A:
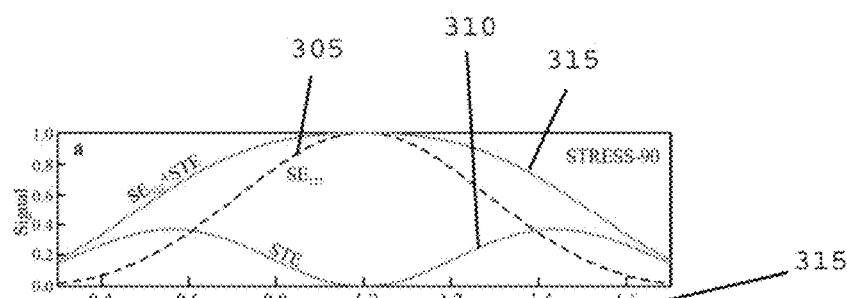
FIGS. 3A-3D are graphs of exemplary $SE_{123}$ STE− pathway magnitudes according to an exemplary embodiment of the present disclosure.
Figure 3B:
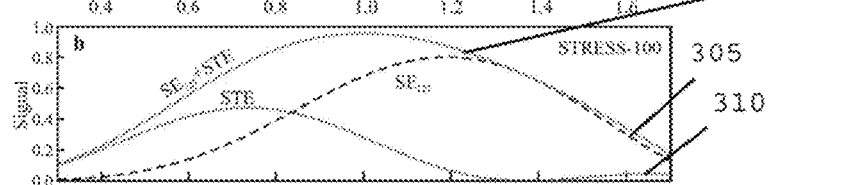
Figure 3C:
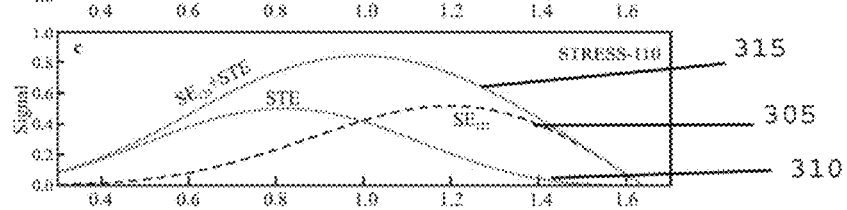
Figure 3D:
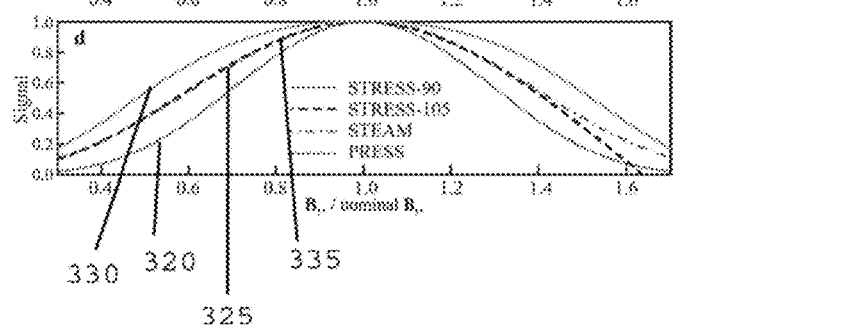

The individual $SE_{123}$ (e.g., line 305) and STE- (e.g., line 310), and combined $SE_{123}$+STE- (e.g., line 315) signal strengths are shown in the graphs of in FIGS. 3A-3C as a function of the nominal B1+ (η) for several members of the exemplary STRESS family. For α=90° (see, e.g., FIG. 3A), the signal strength of $SE_{123}$ can correspond to that of PRESS, illustrating that STRESS-90° can be significantly more robust to B1+ variations than PRESS. This is further shown in FIG. 3D which graph shows the B1+ dependence of PRESS (e.g., line 320), STEAM (e.g., line 325), STRESS-90° (e.g., line 330) and STRESS-105° (e.g., line 335), which show equivalent or superior performance of the exemplary STRESS for typical in vivo B1+.

Exemplary Relaxation Properties of Signal

The STE- can undergo T1 relaxation for 2τ=TE/2 between the first and second pulses, while the $SE_{123}$ undergo T2 relaxation. The signal at TE can, therefore, be weighted by both pathways, for example, for the STRESS-α members of the STRESS family. Thus, for example:

$$S^{(STRESS)} = S_0 \cdot B_{1-} \cdot \frac{1 - e^{-TR/T_1}}{1 - \cos(\eta\alpha)e^{-TR/T_1}} \cdot \quad (3)$$

$$\sin(\eta\alpha)e^{-\frac{TE}{2T_2}}\left[\sin^4\left(\frac{\eta\beta}{2}\right)e^{-\frac{TE}{2R_2}} + \frac{1}{2}\sin^2(\beta\eta)e^{-\frac{TE}{2T_1}}\right].$$

The signal can be proportional to $S_0$, which can be obtained in an exemplary pulse-acquire experiment, where B1-, can be the receiver profile and $(1-e^{-TR/T_1})\cdot(1-\cos(\eta\alpha)e^{-TR/T_1})^{-1}$ can be the dynamic equilibrium weighting-factor. In contrast, the signal in an exemplary PRESS experiment can be, for example:

$$S^{(PRESS)} = S_0 \cdot B_{1-} \cdot \frac{1 - e^{-TR/T_1}}{1 - \cos\left(\frac{\eta\pi}{2}\right)e^{-TR/T_1}} \cdot \sin^5\left(\frac{\eta\pi}{2}\right)e^{-\frac{TE}{T_2}} \quad (4)$$

The differences between Eqs. (3) and (4) can be referred to during absolute or ratio quantification. Even if TR>>T1, the magnitude of the exemplary STRESS echo (see e.g., Eq. (3)) can contain some minor T1 dependence from the STE- component. However, for most cases, TE<<T1, hence exp(-TE/2T1)≈1 with a negligible effect on quantification. Furthermore, since the STE-'s "true TE" (e.g., time it evolves in the transverse plane) can be TE/2, it can be less affected by T2 relaxation compared to the $SE_{123}$ pathway, which can reduce STRESS' SNR penalty relative to PRESS for TE>0. This can be seen quantitatively from Table 2 above, which compares the signals in a homogeneous B1+ field of PRESS with STRESS for TE=40 ms, T2=150 ms and, T1=1200 ms. At TE=40, PRESS's signal can decay to 77% of the full amplitude (e.g., at TE=0), while, for example, that of STRESS-100 (e.g., α/β/γ=100°/131°/131° can almost be identical at 76%. For example, the STRESS-100 SNR can even surpass PRESS by about 20% if approximately 25% B1+ inhomogeneity can be introduced. Thus, although the theoretical SNR of PRESS in the absence of relaxation and B1+ variation can be higher than STRESS for α>90°, near parity can be expected under realistic conditions at fields ≥3 T. The longer TE, the more pronounced the advantage: for TE=100 ms, T2=150 ms, T1=1200 ms, S0=B1-=1, TR=∞ and η=1, Eqs. (3) and (4) illustrate STRESS-100's SNR to be 54% the full spin echo magnitude (e.g., at TE=0), higher than PRESS's 51%.

Exemplary Phase Cycling in STRESS

Phase cycling the pulses' and receiver's phases among different averages can be a common technique for providing additional suppression of unwanted coherence pathways. (See, e.g., References 38 and 39). Exemplary phase cycling procedures for PRESS and STEAM can be translated to STRESS, since a special phase relationship can be maintained between the different pulses to ensure the $SE_{123}$ and STE pathways add constructively. One such exemplary phase relationship, $\varphi_1=0°$, $\varphi_2=\varphi_3=90°$ (e.g., the so-called "CPMG phase relation"), can be provided, where $\varphi_i$ can be the phase of the $i_{th}$ pulse (i=1,2,3). This may not be the only such phase relationship, according to an exemplary embodiment of the present disclosure. For example, setting $\varphi_1=180°$, $\varphi_2=\varphi_3=90°$ and consulting Table 1, which lists the exemplary phases of the different echoes, $SE_{123}$ and STE- can be seen as being once more in phase. As long as the phase of $SE_{123}$ and STE- can be kept equal, the above discussion of STRESS' applicability and advantages holds. According to the exemplary system, method and computer-accessible medium, it can be possible to provide four possible phase cycling schemes, outlined in Table 3 below, which have been labeled C1, C2, C3 and C4. The first exemplary procedure, C1, can be used to alternate the overall phase of the pulse train and can eliminate receiver artifacts. The second exemplary procedure, C2, can suppress SE23, FID2 and FID3. This can be useful, since $SE_{23}$ and $FID_3$ can be responsible for particularly troublesome artifacts (see, e.g., Reference 29), and can also be seen from Table 1 to be the most weakly spoiled pathways in STRESS. The third exemplary procedure, C3, can be used to suppress most, if not all, pathways except FID1 and DC artifacts. The fourth exemplary procedure, C4, can suppress all unwanted coherence pathways, but not DC artifacts. Different cycles can be combined via nesting (see, e.g., Reference 39). However, special care must be taken when nesting different phase cycles. This can involve adding their phases modulo 360°, which may not conserve their exemplary special phase relationships. For example, two STRESS experiments having $(\varphi_1, \varphi_2, \varphi_3)=(0°,90°,90°)$ and $(\varphi_1, \varphi_2, \varphi_3)=(180°,90°,90°)$ can be considered. Although each of these can yield a valid STRESS signal, in which STE- and $SE_{123}$ can both be in phase, the experiment including phases, which can be the direct sum of both, $(\varphi_1, \varphi_2, \varphi_3)=(180°,180°,180°)$, would not and can be inadmissible in a phase cycle.

TABLE 3

| $\varphi_1$ | $\varphi_2$ | $\varphi_3$ | $\varphi_{ADC}$ | $FID_1$ | $FID_2$ | $FID_3$ | $SE_{12}$ | $SE_{13}$ | $SE_{23}$ | $STE_+$ | $STE_-$ | $SE_{12}$ | DC |
|---|---|---|---|---|---|---|---|---|---|---|---|---|---|
| C1: | | | | | | | | | | | | | |
| 0 | 90 | 90 | 0 | 90 | 180 | 180 | 90 | 90 | 0 | 90 | 90 | 90 | 0 |
| 180 | 270 | 270 | 180 | 90 | 180 | 180 | 90 | 90 | 0 | 90 | 90 | 90 | 180 |
| C2: | | | | | | | | | | | | | |
| 0 | 90 | 90 | 0 | 90 | 180 | 180 | 90 | 90 | 0 | 90 | 90 | 90 | 0 |
| 0 | 270 | 270 | 0 | 90 | 0 | 0 | 90 | 90 | 180 | 90 | 90 | 90 | 0 |
| C3: | | | | | | | | | | | | | |
| 0 | 90 | 90 | 0 | 90 | 180 | 180 | 90 | 90 | 0 | 90 | 90 | 90 | 0 |
| 0 | 270 | 270 | 0 | 90 | 0 | 0 | 90 | 90 | 180 | 90 | 90 | 90 | 0 |
| 0 | 0 | 180 | 0 | 90 | 90 | 270 | 270 | 270 | 270 | 270 | 90 | 90 | 0 |
| 0 | 180 | 0 | 0 | 90 | 270 | 90 | 270 | 270 | 90 | 270 | 90 | 90 | 0 |
| C4: | | | | | | | | | | | | | |
| 0 | 90 | 90 | 0 | 90 | 180 | 180 | 90 | 90 | 0 | 90 | 90 | 90 | 0 |
| 0 | 270 | 270 | 0 | 90 | 0 | 0 | 90 | 90 | 180 | 90 | 90 | 90 | 0 |
| 0 | 0 | 180 | 0 | 90 | 90 | 270 | 270 | 270 | 270 | 270 | 90 | 90 | 0 |
| 0 | 180 | 0 | 0 | 90 | 270 | 90 | 270 | 270 | 90 | 270 | 90 | 90 | 0 |
| 180 | 45 | 315 | 0 | 270 | 135 | 45 | 180 | 0 | 135 | 180 | 90 | 90 | 0 |
| 180 | 135 | 225 | 0 | 270 | 225 | 315 | 0 | 180 | 225 | 0 | 90 | 90 | 0 |
| 180 | 225 | 135 | 0 | 270 | 315 | 225 | 180 | 0 | 315 | 180 | 90 | 90 | 0 |
| 180 | 315 | 45 | 0 | 270 | 45 | 135 | 0 | 180 | 45 | 0 | 90 | 90 | 0 |

Table 3 illustrates different phase cycling procedure for the exemplary STRESS experiments. Here $\varphi_1$, $\varphi_2$, $\varphi_3$ can be the phases of pulses 1, 2 and 3, respectively, and $\varphi_{ADC}$ can be the receiver's phase, given in degrees. For each combination $\varphi_1$, $\varphi_2$, $\varphi_3$, $\varphi_{ADC}$, the Table 3 shows the phase of each of the pathways, as calculated from Table 1. DC stands for the phase of any DC artifacts in the signal, and can equal the receiver's phase, $\varphi_{ADC}$. The shaded pathways can be those which cancel out upon addition of the different cycles. For example, all pathways can retain $SE_{123}$ and STE- in-phase (e.g., 90°), which can be beneficial component used by most or all exemplary STRESS experiments.

Exemplary Material and Methods

Exemplary experiments were performed in a 3 T whole body MR imager (e.g., Tim-Trio, Siemens A G, Erlangen Germany), using a transmit-receive head-coil capable of producing 24 μT (1 kHz) of B1+. In-vivo experiments were done on a 31 year old healthy female.

Exemplary Phantom

Exemplary experiments were also performed on a spherical phantom containing water doped with copper sulfate (e.g., T1/T2=660/320 ms), and metabolite concentrations approximating in-vivo human brain: N-Acetyl-L-aspartate (e.g., NAA, 12.5 mM, T1/T2=605/465 ms), choline-chloride (e.g., Cho, 3 mM, T1/T2=235/200 ms), creatine-hydrate (e.g., Cr, 10 mM, T1/T2=336/288 ms), myo-inositol (e.g., 7.5 mM), L-glutamic acid (e.g., 12.5 mM) and DL-lactic acid (e.g., about 5.0 mM). Following an initial localization MRI, a 2D CSI slice was positioned in its center and shimmed to about 5.0 Hz.

An exemplary STRESS–110 sequence (see, e.g., FIG. 4B, α/β/γ=110°/108°/108°) was compared to a standard PRESS (see, e.g., FIG. 4A) in a phantom, using 2D CSI encoding in-plane. The pulses used were all SLR-designed sinc-like with peak B1 of 1.0 kHz: for PRESS, a T90=3.84 ms 90° excitation pulse with about 3.6 kHz bandwidth and two T180=7.68 ms 180°s having about 1 kHz of bandwidth For the exemplary STRESS T110=3.84 ms 110° pulse with 3.2 kHz of bandwidth and two T108=3.84 ms 108°s with 3.15 kHz of bandwidth. TE/TR were 40/1000 ms for both sequences. TE=40 was the minimum facilitated by PRESS, although shorter (e.g., about 24 ms) TEs were attainable with STRESS. Note that the STE– pathway can be stored longitudinally for half the TE=40 ms, making its "true" TE (e.g., time spent in the transverse plane) only 20 ms. According to an exemplary embodiment of the present disclosure, as described herein, "TE" can denote the time between the center of the first excitation pulse and start of acquisition.

Rectilinear k-space sampling was employed with a 2D 20×20 acquisition matrix, 20 mm slice thickness, 80×80 mm2 VOI and 160×160 mm2 FOV (see, e.g., FIG. 5A), resulting in 8×8×20 mm3=1.28 cc nominal voxels. Total acquisition time, including four initial dummy scans, was about 6:46 minutes. An in-house optimized six-pulse about 242 ms long frequency-selective water suppression module preceded excitation. Magnetic field drift correction was implemented. (See, e.g., Reference 28). The transmitter and receiver's carrier frequencies were centered on the NAA at about 2.01 ppm, and the FIDs were each sampled for 1 second at ±1 Kz bandwidth (e.g., about 2048 complex points).

Once obtained, the FIDs from each scan were zero filled to twice their length, arranged in a three dimensional kx-ky-t matrix and Fourier transformed over all axes. Automated 0th order phasing was performed in each voxel using the NAA peak as a reference. Gaussian apodization was applied in the time domain to improve the SNR. "SNR maps" of the NAA (e.g., about 2.01 ppm), Cho (e.g., about 3.2 ppm) and CH2 peak of creatine (e.g., about 3.9 ppm) were obtained by dividing their peak height by the standard deviation of the noise over the metabolite-free 8-10 ppm range in each voxel.

Due to, for example, dielectric resonances at 3 T, non-negligible B1+ variation were encountered within the VOI. To monitor them, and also demonstrate insensitivity of the exemplary STRESS to them, a 2D Actual Flip Angle imaging sequence was used to obtain B1+ maps at an isotropic 5×5×5 mm3 spatial resolution, with TR1/TR2/TE=20/100/10 ms for a 3:12 minutes total acquisition time.

Exemplary In Vivo Brain Experiments

The exemplary experiments were repeated in a healthy, 31 year old female. A localizer was followed by an about 5:36 minute 3D MP-RAGE (e.g., 256×256×192 mm3 FOV, 1 mm3 isotropic). An in-house auto-shim routine then optimized the whole-head B0 homogeneity in ~5 minutes to 24 Hz. (See, e.g., Reference 29). This was followed by two 2D CSI from a supra-ventricular slice using PRESS and the exemplary STRESS–110 (e.g., VOI shim: 17 Hz). Acquisition parameters for both were: TR/TE=1000/40 ms, 16×16 matrix, 160×160 mm2 FOV, 80×80 mm2 VOI, 15 mm slice thickness, 4 averages for a total of about 17:08 minutes. As with the phantom above, the about 40 ms TE was the minimum for PRESS, given the amount of spoiling and pulse lengths, although a TE as low as about 26.6 ms was attainable with STRESS–110. A 3D flip angle imaging sequence followed to obtain B1+ maps for the 1H-MRSI slice. The protocol took 49 minutes. Post processing was, for example, identical to the phantom, including the SNR maps.

Exemplary Results Phantom

Sample STRESS–110 and PRESS spectra from a column of voxels through the phantom's center, are shown FIGS. 5B and 5C. They readily exhibit two features: (i) slightly lower SNR for STRESS–110, and (ii) greater CSD for PRESS. These can be further supported by the SNR maps of NAA, Cho and the $CH_2$ peak of Cr (e.g., 0 Hz, 150 Hz and 235 Hz off resonance), shown in FIGS. 6A-6C. These exemplary maps show the reduced in-plane CSD (e.g., relative to NAA) for Cho and the $CH_2$ peak of Cr, estimated using the centers of the one dimensional slice profiles. The results for STRESS–110 were +4 mm for Cho and +6 mm for $CH_2$—Cr, while for PRESS they were +12 mm for Cho and +22 mm for $CH_2$—Cr (e.g., some minor estimation errors were invariably incurred due to the discrete, sampled nature of the slice profiles). These can be in agreement with the ratio in bandwidths employed in-plane, which predict a 3-fold decrease in CSD for STRESS–110. Note that all pulses shared the same peak B1 to ensure a fair comparison.

Averaging over the middle 5×5 voxels can reveal that the mean STRESS SNR for NAA can be about 85% that of PRESS, while for Cho it can be 86%, in close agreement with the 83% theoretical predictions for STRESS–110 in Table 2. The slight increase can be explained by the finite T2s and B1+ variations. This can be supported by the ±10% variation in the nominal B1+ mapped across the slice.

The exemplary spectra (see, e.g., FIG. 5B) can indicate most or all metabolites for both STRESS–110 and PRESS. For example, despite combining two pathways, J-coupled peaks, such as lactate or myo-inositol, do not suffer visible dephasing or destructive interference in STRESS–110 compared with PRESS.

Exemplary In Vivo Brain Results

Figure 7A:
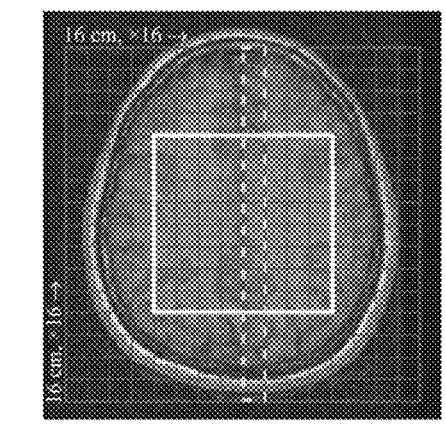
FIG. 7A is an exemplary image of exemplary placements and encoding for FOV and VOI according to an exemplary embodiment of the present disclosure.
Figure 7B:
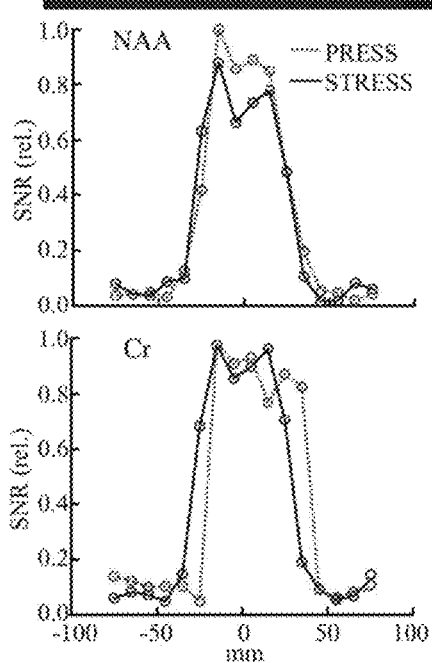
FIGS. 7B and 7C are graphs of exemplary in vivo results according to an exemplary embodiment of the present disclosure.
Figure 7C:
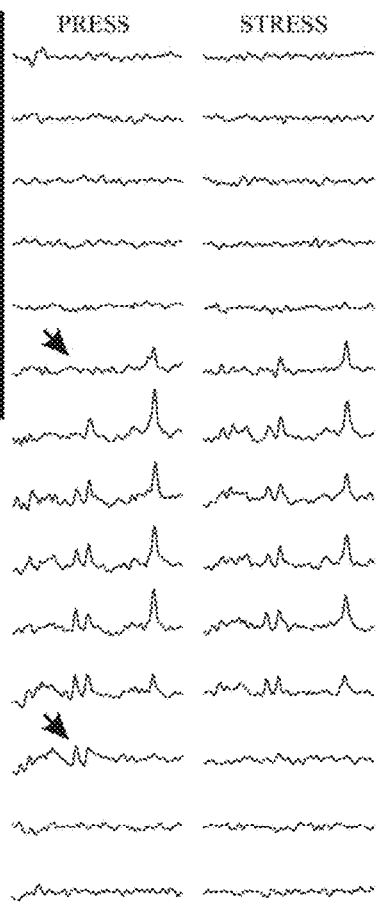

The same sequences were evaluated in a 2D supra-ventricular slice from the brain of a volunteer (see e.g., FIG. 7B). For example, the NAA and Cr methyl singlets' SNR for a 16 voxel column is shown in FIG. 7B, and the spectra for PRESS and STRESS–110 are shown in FIG. 7C. B1+ mapping showed its nominal values to be 0.95±0.09 (e.g., mean±SD) across the VOI.

Both the spectra and 1D SNR plots substantially confirm the theoretical predictions, that, for example: (i) the STRESS averaged NAA SNR in the central 4×4 group of voxels can be 83% that of PRESS, in agreement with the predictions of Table 2 and Eq. (1); and (ii) substantial CSD can be observed in PRESS, with Cr and Cho peaks appearing outside the VOI (see, e.g., arrows provided in FIG. 7C). This full-voxel shift can also be seen in the 1D SNR map of Cr in FIG. 7B, but can be too small to be observed in the STRESS data.

The 1D Cr SNR map (see, e.g., FIG. 7B) indicate that, unlike NAA, its STRESS signal can almost be identical to PRESS. Quantitatively, the mean Cr SNR in the central 4×4 voxel group was only about 3% lower in STRESS than PRESS, once-again in agreement with the theoretical predictions. The transverse relaxation times of Cr can be substantially shorter than NAA's in the brain at 3T, averaging at around 150-200 ms with values as low as about 140 ms in the globus pallidus. (See, e.g., References 30 and 31). With the observed approximately 10% spatial B1+ inhomogeneities, Eqs. (3) and (4), as well as Table 2, indicate that both signals can be expected to be almost equal, highlighting an important point that under realistic conditions, the SNR penalty of STRESS can often be minimal. For example, STRESS' SNR can even exceed PRESS at higher fields (e.g., >3 Tesla), where T2s shorten and B1+ inhomogeneity worsens.

Exemplary Discussion

For example, two exemplary popular 1H-MRS localization modules, for example, PRESS and STEAM, can be designed to acquire a specific coherence pathway, while dephasing all others. By acquiring $SE_{123}$ and STE− simultaneously, for example, the exemplary system, method and computer-accessible medium according to an exemplary embodiment of the present disclosure, can be used to trade some SNR for significantly reduced TE, CSD and SAR, as well as increased immunity to B1+ variations. As shown in-vivo for Cr, this SNR loss can be expected to be small, approximately 12%, or even be a gain under realistic acquisition conditions at 3 T and up (e.g., short T2s, substantial B1+ inhomogeneities). The exemplary STRESS family of sequences can therefore be thought of as a hybrid STEAM/PRESS sequence, parameterized by the flip angle of the first pulse. Unlike STEAM, which can be designed to refocus either STE− or STE+ (see, e.g., Reference 25), STRESS can refocus STE− since the spoiling gradients may not be adjusted to refocus both $SE_{123}$ and STE+.

Figure 4B:
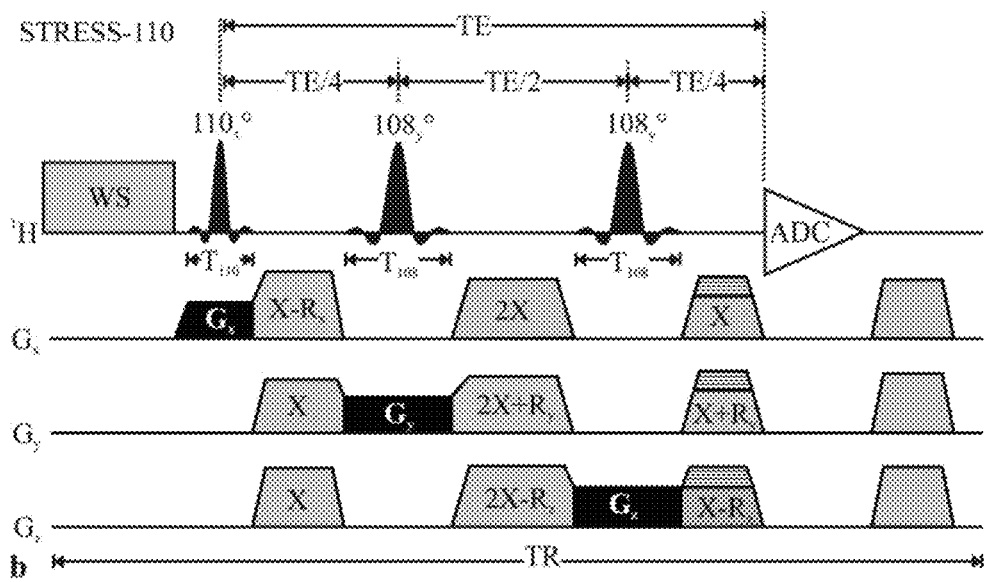

Two exemplary practical considerations can be noted: (i) phase encoding in 1H-MRSI can be applied after the third pulse, as shown in FIG. 4B. For example, placing it between the first and second RF pulses can produce mirror images for the STE− and $SE_{123}$ pathways, since the former can invert the first gradient moment, while the latter may not. Phase encoding after the second pulse may not affect the STE and (ii) the STE− can be generated by storing the magnetization with the second RF pulse, and reading it with the third. Consequently, unlike PRESS, the in-plane VOI-selection gradients may not be self-refocused, necessitating rewinding gradients after the third RF pulse that can also be added between the second and third, to balance the total moment the $SE_{123}$ pathway experiences.

Simultaneous acquisition of spin and stimulated echoes can be inherent to one of the earlier pulse sequences (e.g., albeit for a different purpose): the Meiboom-Gill variant (see, e.g., Reference 26) of the Carr-Purcell echo train (see, e.g., Reference 32), used in NMR and MRI. A recent coherence pathways analysis pinpointed the refocused STEs as the cause of its immunity to B1+ variations. (See, e.g., Reference 27). A "standard" PRESS sequence cannot benefit from this immunity since STE+ and STE− can be normally spoiled. The exemplary system, method and computer-accessible medium does not spoil the STE− and when $\alpha/\beta/\gamma=90°/180°/180°$, it can be similar to PRESS, but with added benefit of B1+ variation immunity due to the incorporated CPMG condition (see, e.g., FIG. 3D).

The exemplary system, method and computer-accessible medium according to an exemplary embodiment of the present disclosure—with its short, high bandwidth pulses—can share many of STEAM's advantages, including small CSD, low SAR and shorter available TEs. While short TEs can also be achieved with PRESS by shortening the duration of 180°s, short refocusing pulses in PRESS can often suffer from much wider transition bands compared to lower flip angle pulses of equal duration. This can severely impact the spectral quality at the VOI's edges in-plane. The 25%-lower SAR of the exemplary system, method and computer-accessible medium facilitates shortening of the TR for (e.g., ~12% here) higher SNR/unit-time or larger spatial coverage in 3D 1H-MRSI. (See, e.g., Reference 10).

Another exemplary feature common to STEAM and the exemplary system, method and computer-accessible medium, according to an exemplary embodiment of the present disclosure, can be a slightly wider (e.g., approximately 10%) and sharper slice profile, due to the STE-component, compared to PRESS with pulses of similar peak B1 and bandwidths. (See, e.g., Reference 9). For example, even with the same pulses (e.g., 90°-180°-180°), a PRESS VOI can be slightly narrower than the exemplary STRESS–90. To match VOI profiles, the selective gradients can be increased by approximately 10%, yielding additional CSD reduction for the exemplary STRESS–90. Full numerical 3D simulations of the expected VOI profiles were done for the PRESS and the exemplary STRESS–110, and the selection gradients were calibrated to equalize VOI widths.

The exemplary $SE_{123}$ signal can remain transverse between the second and third pulses, while STE− can be stored longitudinally for $2\tau=TE/2$. The two pathways, therefore, can differ in their relaxation and evolution during that period, which can create a more complex dependency on T1, T2 and B1+ inhomogeneity than in STEAM or PRESS, as seen by comparing Eqs. (3) and (4). Knowledge of T1 and T2 can be used for absolute quantification in either case. However, B1 dependency in PRESS can be cancelled out by taking metabolite ratios between, for example, NAA and a reference water scan, where, for example:

$$\frac{S_{NAA}^{(PRESS)}}{S_{water}^{(PRESS)}} = \frac{S_{0,NAA}}{S_{0,water}} \cdot \frac{1-E_{1,NAA}}{1-E_{1,water}} \cdot \frac{e^{-TE/T_{2,NAA}}}{e^{-TE/T_{2,water}}}, \quad (5)$$

with $E_{1,NAA}=e^{-TR/T_{1,NAA}}$, $E_{1,water}=e^{-TR/T_{1,water}}$, and assuming $\cos(\eta\alpha)\approx 0$ for the $\alpha=90°$ used in PRESS, an excellent approximation for the B1+ variations encountered in-vivo. In contrast, this B1+ dependence remains for the exemplary system, method and computer-accessible medium which can be, for example:

$$\frac{S_{NAA}^{(STRESS)}}{S_{water}^{(STRESS)}} = \frac{S_{0,NAA}}{S_{0,water}} \cdot \frac{\dfrac{1-E_{1,NAA}}{1-\cos(\alpha\eta)E_{1,water}}}{\dfrac{1-E_{1,water}}{1-\cos(\alpha\eta)E_{1,NAA}}} \cdot \quad (6)$$

$$\frac{e^{-TE/2T_{2,NAA}}}{e^{-TE/2T_{2,water}}} \cdot \frac{\sin^4\left(\dfrac{\eta\beta}{2}\right)e^{-TE/2T_{2,NAA}} + \dfrac{1}{2}\sin^2(\beta\eta)}{\sin^4\left(\dfrac{\eta\beta}{2}\right)e^{-TE/2T_{2,water}} + \dfrac{1}{2}\sin^2(\beta\eta)},$$

where $e^{-TE/2T_1} \approx 1$ can be approximated for NAA and water. Eq. (6) shows that for quantification the exemplary STRESS can utilize a B1+ map in addition to T1 and T2. Assuming a homogeneous B1+ ($\eta=1$) in Eq. (6) an error can be introduced, E, quantified by the ratio of the actual ($\eta \neq 1$) and assumed ($\eta=1$) signals where, for example:

$$E = \left(1 - \frac{S_{NAA}^{(STRESS)}}{S_{water}^{(STRESS)}} \cdot \frac{S_{water,\eta=1}^{(STRESS)}}{S_{NAA,\eta=1}^{(STRESS)}}\right) \cdot 100\% \qquad (7)$$

Its magnitude can depend on TR, TE, T2 and T1 of the two species, $\eta$ and $\beta$. For example, for the exemplary STRESS-100 (e.g., $\alpha/\beta/\gamma=100°/131°/131°$), TE=40 ms, T2, NAA=150 ms, T2, water=80 ms, T1,NAA=1200 ms, T1, water=800 ms, TR=1000 ms and 20% B1+ inhomogeneity (e.g., $\eta=0.8$), E=2%. E can rarely exceed 5% for these parameters' range in-vivo, on par with other confounds in ratio quantification. (See, e.g., Reference 33).

Due to the presence of both $SE_{123}$ and STE− in the signal of the exemplary system, method and computer-accessible medium, spectral fitting can account for the true evolution of the spins, using sequence-specific basis sets. This, however, for example, may not be different from PRESS and STEAM, that can also use customized basis sets for quantification, nor are these sets a priori more complicated. Note, however, that at long TEs, some interference can occur between the $SE_{123}$ and STE− signals for J-coupled metabolites that may not occur at short TEs, as seen from the lactate and myo-inositol peaks in the phantom (see e.g., FIGS. 5B and 5C).

As T1 and T2 relaxation can be introduced, the maximum of the signal curve (see e.g., Eq. (3)) as a function of the B1+ inhomogeneity, $\eta$, can shift slightly from the nominal B1+, such that Eq. (2) may no longer hold true. However, the optimal $\eta$ for the ranges of B1+, T1 and T2 in vivo was found to be very close to about 1.0, with deviations of only a few percent. Since the exemplary system, method and computer-accessible medium already benefits from significant immunity B1+ variations, this shift can be negligible in practice.

Other sources of artifacts must be kept in mind. For example, a time-dependent resonant frequency drift due to, for example, eddy currents, can affect the transverse $SE_{123}$ pathway between the second and third pulses, but can leave the longitudinal STE− untouched. Magnets susceptible to eddy currents can, therefore, apply pre-emphasis gradient pulses (see, e.g., Reference 34), or use field mapping for quality assurance. (See, e.g., Reference 35). The exemplary spectra line shapes in FIGS. 6A-6C and 7A-7C show minimal to nonexistent eddy current effects. Another source of resonance frequency time-dependence can be due to the spins' diffusion during spoiling gradients. This loss during a $\tau=10$ ms 10 mT/m spoiler, for pure water (e.g., D≈2 μm2/msec) can be $\exp(-\frac{1}{3}\gamma^2DG^2\tau^3) \approx \exp(-10^{-4}) \approx 1$ (see, e.g., Reference 36), becoming even more negligible in-vivo due to metabolites' lower diffusion coefficients (see, e.g., Reference 37). The diffusion decay can be modeled using a pair of Stejskal-Tanner gradient pulses. The results can show that, except for very strong spoiling gradients and long echo times, the diffusion losses of STEAM can be negligible. (See, e.g., Reference 9).

Although the exemplary system, method an computer-accessible medium according to an exemplary embodiment of the present disclosure, can reduce the in-plane mutations considerably, it can be used to increase the first pulse's flip angle, $\alpha$, compared to PRESS and STEAM, leading to increased CSD in that direction, and higher SAR. However, since $\alpha$ can be kept closer to 90° than 180°, the increases can be small. For example, using a peak B1 of about 1.0 kHz, the FWHM bandwidth of the SLR-designed first pulse of the exemplary STRESS-110 (e.g., $\alpha=110°$) was about 3.2 kHz, versus about 3.4 kHz of the PRESS SLR 90°; increasing the slice CSD by only about 6%. Although the SAR of the exemplary STRESS' 110°slice selection pulse was about 20% higher than that of the 90° used in PRESS, the exemplary STRESS' total SAR was about 25% lower than PRESS in practice.

Figure 8:
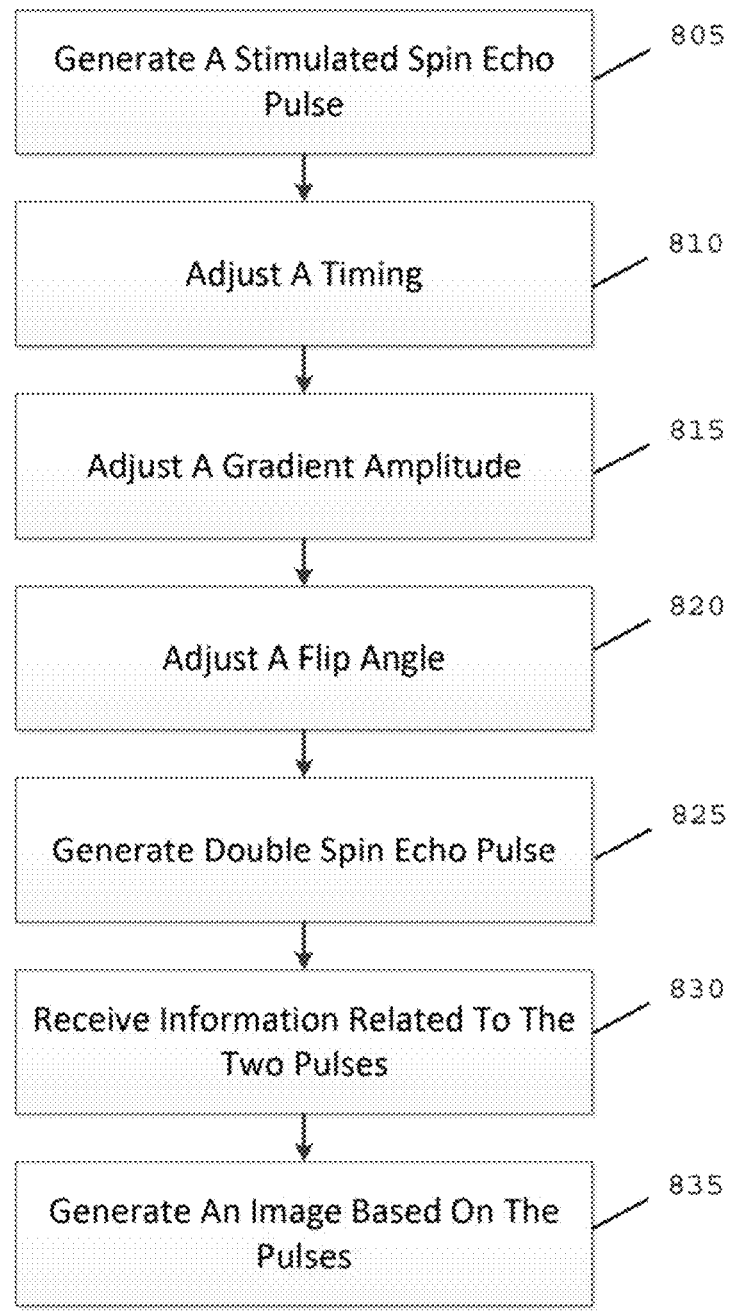
FIG. 8 is a flow diagram of an exemplary method for performing magnetic resonance spectroscopy according to an exemplary embodiment of the present disclosure.
Figure 9:
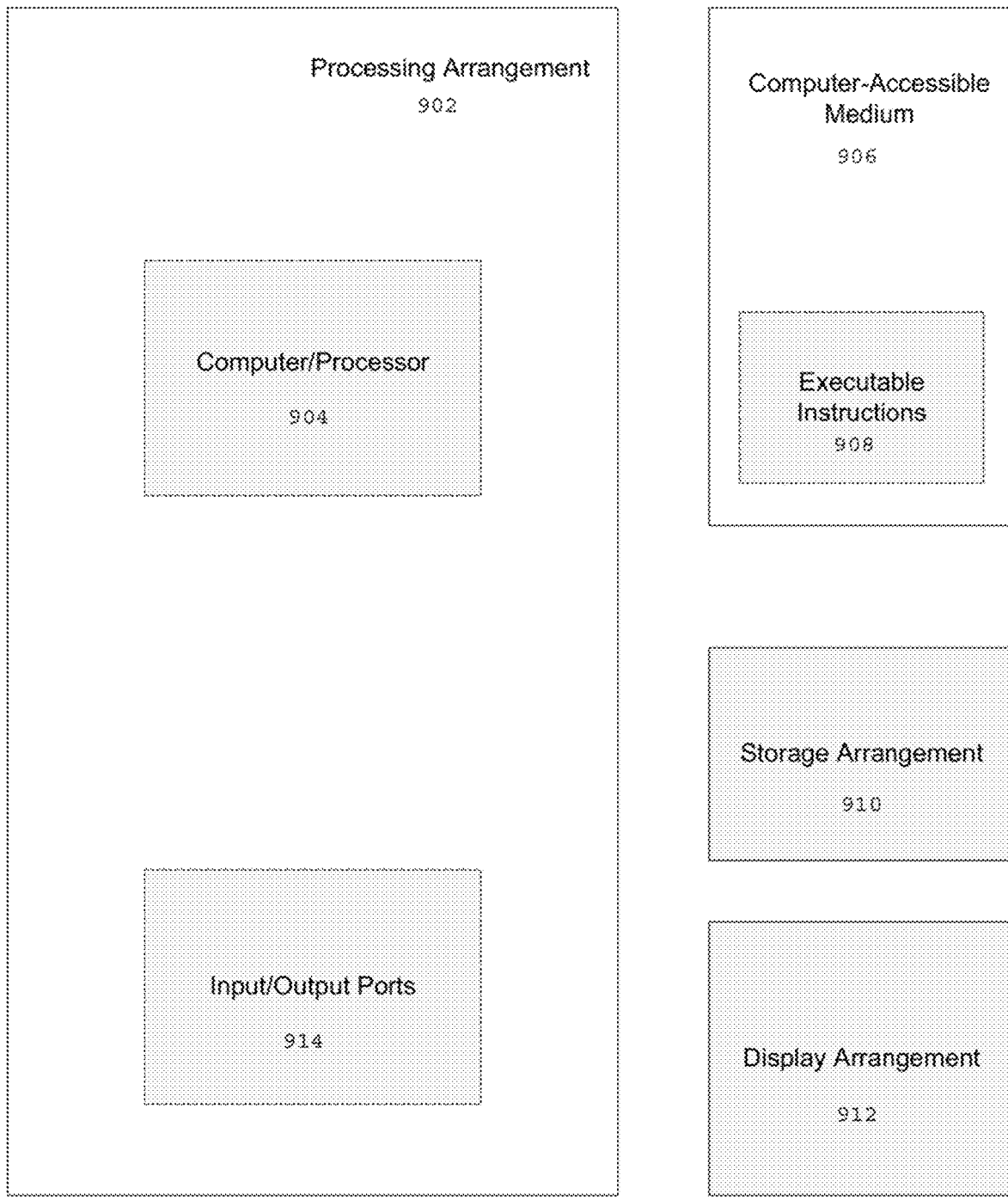
FIG. 9 is an illustration of an exemplary block diagram of an exemplary system in accordance with certain exemplary embodiments of the present disclosure.

FIG. 8 shows a flow diagram of an exemplary method for performing magnetic resonance spectroscopy according to an exemplary embodiment of the present disclosure, which can be implemented using a computer system or other devices which are specifically configured or programmed to do so, e.g., including but not limited to the exemplary system shown in FIG. 9. For example, at procedure 805, a stimulated spin echo pulse or pathway can be generated. A timing (e.g., at procedure 810), a gradient amplitude (e.g., at procedure 815) and/or a flip angle (e.g., at procedure 820), can be adjusted before a double spin echo pulse is generated at procedure 825. At procedure 830, information regarding the stimulated spin echo pulse and the double spin echo pulse can be received, and an image that is based on the two pulses can be generated at procedure 835.

Exemplary Conclusions

Simultaneous acquisition of the spin- and stimulated-echo pathways, according to an exemplary embodiment of the present disclosure, can generate a family of sequences, dubbed STRESS that can combine the advantages of STEAM (e.g., low SAR, CSD, short TE) with the higher signal intensities normally associated with PRESS and the superior B1+ immunity associated with a CPMG train. When $\alpha=90°$, $\beta=\gamma=180°$, the exemplary STRESS can coincide with PRESS, but can also properly combine the CPMG condition for greater B1+ immunity. When $90°<\alpha<136°$, the sequence can sacrifice some of the full spin-echo amplitude for a considerable reduction in SAR and in-plane CSD compared to PRESS. Although the results presented here focused on 1H-MRSI, the exemplary system, method and computer-accessible medium, according to an exemplary embodiment of the present disclosure can be equally and/or similarly applicable and effective for single-voxel 1H-MRS. The modification suggested can be simple, subtle and incorporate easily into existing PRESS or STEAM sequences.

FIG. 9 shows a block diagram of an exemplary embodiment of a system according to the present disclosure. For example, exemplary procedures in accordance with the present disclosure described herein can be performed by a processing arrangement and/or a computing arrangement 902. Such processing/computing arrangement 902 can be, for example, entirely or a part of, or include, but not limited to, a computer/processor 904 that can include, for example, one or more microprocessors, and use instructions stored on a computer-accessible medium (e.g., RAM, ROM, hard drive, or other storage device).

As shown in FIG. 9, for example, a computer-accessible medium 906 (e.g., as described herein above, a storage device such as a hard disk, floppy disk, memory stick, CD-ROM, RAM, ROM, etc., or a collection thereof) can be provided (e.g., in communication with the processing arrangement 902). The computer-accessible medium 906 can contain executable instructions 908 thereon. In addition or alternatively, a storage arrangement 910 can be provided separately from the computer-accessible medium 906, which can provide the instructions to the processing arrangement 902 so as to configure the processing arrangement to execute certain exemplary procedures, processes and methods, as described herein above, for example.

Further, the exemplary processing arrangement 902 can be provided with or include an input/output arrangement 914, which can include, for example, a wired network, a wireless network, the internet, an intranet, a data collection probe, a sensor, etc. As shown in FIG. 9, the exemplary processing arrangement 902 can be in communication with an exemplary display arrangement 912, which, according to certain exemplary embodiments of the present disclosure, can be a touch-screen configured for inputting information to the processing arrangement in addition to outputting information from the processing arrangement, for example. Further, the exemplary display 912 and/or a storage arrangement 910 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties. Additional exemplary embodiments of the present disclosure are provided and described in the enclosed Appendix and drawing(s).

EXEMPLARY REFERENCES

The following references are hereby incorporated by reference in their entireties.
1. Bottomley P A. Spatial localization in NMR spectroscopy in vivo. Ann N Y Acad Sci 1987; 508:333-348.
2. Frahm J, Merboldt K D, Hanicke W. Localized proton spectroscopy using stimulated echoes. Journal of Magnetic Resonance 1987; 72:502-508.
3. Brown T R, Kincaid B M, Ugurbil K. NMR Chemical Shift Imaging in Three Dimensions. Proceedings of the National Academy of Sciences 1982; 79(11):3523-3526.
4. Maudsley A A, Hilal S K, Perman W H, Simon H E. Spatially resolved high resolution spectroscopy by "four-dimensional" NMR. Journal of Magnetic Resonance 1983; 51(1):147-152.
5. Keevil S F. Spatial localization in nuclear magnetic resonance spectroscopy. Phys Med Biol 2006; 51(16):R579-636.
6. Moonen C T W, Sobering G, Van Zijl P C M, Gillen J, Kienlin Mv, Bizzi A. Proton Spectroscopic Imaging of Human Brain. Journal of Magnetic Resonance 1992; 98:556-575.
7. Burstein D. Stimulated echoes: description, applications, practical hints. Concepts in Magnetic Resonance 1996; 8(4):269-278.
8. Yongbi N M, Payne G S, Collins D J, Leach M O. Quantification of signal selection efficiency, extra volume suppression and contamination for ISIS, STEAM and PRESS localized 1H NMR spectroscopy using an EEC localization test object. Phys Med Biol 1995; 40(7):1293-1303.
9. Moonen C T, von Kienlin M, van Zijl P C, Cohen J, Gillen J, Daly P, Wolf G. Comparison of single-shot localization methods (STEAM and PRESS) for in vivo proton NMR spectroscopy. NMR in Biomedicine 1989; 2(5-6):201-208.
10. Goelman G, Liu S, Hess D, Gonen O. Optimizing the efficiency of high-field multivoxel spectroscopic imaging by multiplexing in space and time. Magn Reson Med 2006; 56(1):34-40.
11. Goelman G, Liu S, Fleysher R, Fleysher L, Grossman R I, Gonen O. Chemical-shift artifact reduction in Hadamard-encoded MR spectroscopic imaging at high (3T and 7T) magnetic fields. Magn Reson Med 2007; 58(1):167-173.
12. Janich M A, Schulte R F, Schwaiger M, Glaser S J. Robust slice-selective broadband refocusing pulses. Journal of Magnetic Resonance 2011; 213(1):126-135.
13. Janich M A, McLean M A, Noeske R, Glaser S J, Schulte R F. Slice-selective broadband refocusing pulses for the robust generation of crushed spin-echoes. Journal of Magnetic Resonance 2012; 223:129-137.
14. Schulte R F, Le Roux P, Vogel M W, Koenig H. Design of phase-modulated broadband refocusing pulses. Journal of Magnetic Resonance 2008; 190(2):271-279.
15. Slotboom J, Mehlkopf A F, Bovee W M M J. A single-shot localization pulse sequence suited for coils with inhomogeneous RF fields using adiabatic slice-selective RF pulses. Journal of Magnetic Resonance 1991; 95:396-404.
16. Wijnen J P, van Asten J J A, Klomp D W J, Sjobakk T E, Gribbestad I S, Scheenen T W J, Heerschap A. Short echo time 1H MRSI of the human brain at 3T with adiabatic slice-selective refocusing pulses; reproducibility and variance in a dual center setting. Journal of Magnetic Resonance Imaging 2010; 31(1):67-70.
17. McNab J A, Bartha R. Quantitative short echo-time 1H LASER-CSI in human brain at 4T. NMR in Biomedicine 2006; 19:999-1009.
18. Scheenen T W J, Klomp D W J, Wijnen J P, Heerschap A. Short Echo Time 1H-MRSI of the Human Brain at 3T With Minimal Chemical Shift Displacement Errors Using Adiabatic Refocusing Pulses. Magn Reson Med 2008; 59:1-6.
19. Gan Z, Kwak H T. Enhancing MQMAS sensitivity using signals from multiple coherence transfer pathways. Journal of Magnetic Resonance 2004; 168(2):346-351.
20. Wijmenga S S, van Mierlo C P, Steensma E. Doubly sensitivity-enhanced 3D TOCSY-HSQC. J Biomol NMR 1996; 8(3):319-330.
21. Palmer III A G, Cavanagh J, Weight P E, Rance M. Sensitivity improvements in proton-detected two-dimensional heteronuclear correlation NMR spectroscopy. Journal of Magnetic Resonance 1991; 93(1):151-170.

22. Gyngell M L. The application of steady-state free precession in rapid 2DFT NMR imaging: FAST and CE-FAST sequences. Magnetic Resonance Imaging 1988; 6(4):415-419.
23. Ong H, Chin C L, Wehrli S L, Tang X, Wehrli F W. A new approach for simultaneous measurement of ADC and T2 from echoes generated via multiple coherence transfer pathways. Journal of Magnetic Resonance 2005; 173(1): 153-159.
24. Shi X, Kim S E, Jeong E K. Single-shot T1 mapping using simultaneous acquisitions of spin- and stimulated-echo-planar imaging (2D ss-SESTEPI). Magn Reson Med 2010; 64(3):734-742.
25. Zhu J M, Smith I C. Stimulated anti-echo selection in spatially localized NMR spectroscopy. J Magn Reson 1999; 136(1):1-5.
26. Meiboom S, Gill D. Modified Spin-Echo Method for Measuring Nuclear Relaxation Times. Reviews of Scientific Instruments 1958; 29(8):688-691.
27. Song Y Q. Categories of coherence pathways for the CPMG sequence. Journal of Magnetic Resonance 2002; 157(1):82-91.
28. Tal A, Gonen O. Localization errors in MR spectroscopic imaging due to the drift of the main magnetic field and their correction. Magn Reson Med 2012.
29. Hu J, Javaid T, Arias-Mendoza F, Liu Z, McNamara R, Brown T R. A fast, reliable, automatic shimming procedure using 1H chemical-shift-imaging spectroscopy. Journal of Magnetic Resonance B 1995; 108:213-219.
30. Kirov II, Fleysher L, Fleysher R, Patil V, Liu S, Gonen O. Age dependence of regional proton metabolites T2 relaxation times in the human brain at 3T. Magn Reson Med 2008; 60(4):790-795.
31. Traber F, Block W, Lamerichs R, Gieseke J, Schild H H. 1H metabolite relaxation times at 3.0 tesla: Measurements of T1 and T2 values in normal brain and determination of regional differences in transverse relaxation. Journal of Magnetic Resonance Imaging 2004; 19(5):537-545.
32. Can H Y, Purcell E M. Effects of Diffusion on Free Precession in Nuclear Magnetic Resonance Experiments. Physical Review 1954; 94(3):630-638.
33. Li B S Y, Wang H, Gonen O. Metabolite ratios to assumed stable creatine level may confound the quantification of proton brain MR spectroscopy. Magnetic Resonance Imaging 2003; 21(8):923-928.
34. Boesch C, Gruetter R, Martin E. Temporal and spatial analysis of fields generated by eddy currents in superconducting magnets: optimization of corrections and quantitative characterization of magnet/gradient systems. Magn Reson Med 1991; 20(2):268-284.
35. Barmet C, De Zanche N, Pruessmann K P. Spatiotemporal Magnetic Field Monitoring for MR. Magn Reson Med 2008; 60:187-197.
36. Torrey H C. Bloch equations with diffusion terms. Physical Review 1956; 104(3):563-565.
37. Kroenke C D, Ackerman J J, Yablonskiy D A. On the nature of the NAA diffusion attenuated MR signal in the central nervous system. Magn Reson Med 2004; 52(5): 1052-1059.
38. Hennig J. The application of phase rotation for localized in vivo proton spectroscopy with short echo times. Journal of Magnetic Resonance 1992; 96:40-49.
39. Wokaun A, Ernst R R. Selective Detection of Multiple Quantum Transitions in Nmr by 2-Dimensional Spectroscopy. Chem Phys Lett 1977; 52(3):407-412.

What is claimed is:

1. A non-transitory computer-accessible medium having stored thereon computer-executable instructions for performing magnetic resonance spectroscopy for at least one structure, wherein, when a computer hardware arrangement executes the instructions, the computer arrangement is configured to perform procedures comprising:
    generating at least one pulse sequence directed to a single region of interest (ROI) on the at least one structure, wherein the at least one pulse sequence includes at/east three sequential radiofrequency (RF) pulses each being at least substantially orthogonal to one another; and
    simultaneously receiving a stimulated echo pathway associated with the single ROI and a double spin echo associated with the single ROI based on the at least one pulse sequence, wherein the stimulated echo pathway and the double spin echo have a matching phase.

2. The computer-accessible medium of claim 1, wherein the stimulated echo pathway and the double spin echo constructively interfere with one another.

3. The computer-accessible medium of claim 1, wherein the stimulated echo pathway has a first weight and the double spin echo has a second weight which is the same as the first weight.

4. The computer-accessible medium of claim 1, wherein the at least three sequential RF pulses have a predetermined flip angle, a predetermined phase, and a predetermined delay, and are provided between adjacent ones of the at least three sequential RF pulses.

5. The computer-accessible medium of claim 4, wherein the at least three sequential RF pulses have a first flip angle and a first phase, a second flip angle and a second phase, and a third flip angle and a third phase there between.

6. The computer-accessible medium of claim 5, wherein the first angle is between about 90 degrees to about 140 degrees.

7. The computer-accessible medium of claim 5, wherein the second flip angle and the third flip angle are the same.

8. The computer-accessible medium of claim 5, wherein the second angle and the third angle depend on the first angle.

9. The computer-accessible medium of claim 1, wherein a sum of the stimulated echo pathway and the double spin echo is insensitive to $B_0$ field inhomogeneities and RF $B_1$ field inhomogeneities.

10. The computer-accessible medium of claim 4, wherein the computer arrangement is further configured to adjust the predetermined delay between the adjacent ones of the at least three sequential RF pulses.

11. The computer-accessible medium of claim 10, wherein the computer arrangement is further configured to adjust the delay such that a stimulated echo pathway pulse and a respective double spin echo pulse refocus at a same time with a same phase.

12. The computer-accessible medium of claim 4, wherein the computer arrangement is further configured to adjust gradient amplitudes between the adjacent ones of the at least one three sequential RF pulses.

13. The computer-accessible medium of claim 4, wherein the computer arrangement is further configured to adjust the predetermined flip angle of the adjacent ones of the at least three sequential RF pulses.

14. The computer-accessible medium of claim 1, wherein the computer arrangement is further configured to generate at least one spectrum from the single ROI based on the stimulated echo pathway and the double spin echo.

15. The computer-accessible medium of claim 1, wherein the stimulated echo pathway and the double spin echo have different relaxation times.

16. The computer-accessible medium of claim 1, wherein the computer arrangement is further configured to apply at least one of a pre-emphasis gradient pulse or a field mapping applied to the double spin echo to prevent a resonant frequency drift of the double spin echo.

17. The computer-accessible medium of claim 1, wherein the stimulated echo pathway includes at least two stimulated echoes pulses.

18. The computer-accessible medium of claim 1, wherein the double spin echo includes at least four spin echo pulses.

19. A method for performing magnetic resonance spectroscopy for at least one structure, comprising:
generating at least one pulse sequence directed to a single region of interest (ROI) on the at least one structure, wherein the at least one pulse sequence includes at least three sequential radiofrequency (RF) pulses each being at least substantially orthogonal to one another; and
simultaneously receiving a stimulated echo pathway associated with the single ROI and a double spin echo associated with the single ROI based on the at least one pulse sequence, wherein the stimulated echo pathway and the double spin echo have a matching phase.

20. A system for performing magnetic resonance spectroscopy for at least one structure, comprising:
a computer hardware arrangement configured to:
generate at least one pulse sequence directed to a single region of interest (ROI) on the at least one structure, wherein the at least one pulse sequence includes at least three sequential radiofrequency (RF) pulses each being at least substantially orthogonal to one another; and
simultaneously receive a stimulated echo pathway associated with the single ROI and a double spin echo associated with the single ROI based on the at least one pulse sequence, wherein the stimulated echo pathway and the double spin echo have a matching phase.

21. The computer-accessible medium of claim 1, wherein the stimulated echo and the double spin echo have a time duration which is equal to one another.

22. The computer-accessible medium of claim 1, wherein the at least three sequential RF pulses are spatially selective RF pulses.

23. The computer-accessible medium of claim 1, wherein at least two of the at least three sequential RF pulses are excitation and refocusing pulses.

* * * * *